(12) United States Patent
Yanagi

(10) Patent No.: US 8,890,243 B2
(45) Date of Patent: Nov. 18, 2014

(54) SEMICONDUCTOR DEVICE

(71) Applicant: Renesas Electronics Corporation, Kanagawa (JP)

(72) Inventor: Shinichiro Yanagi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 65 days.

(21) Appl. No.: 13/686,900

(22) Filed: Nov. 27, 2012

(65) Prior Publication Data

US 2013/0134510 A1 May 30, 2013

(30) Foreign Application Priority Data

Nov. 28, 2011 (JP) ................................. 2011-258570

(51) Int. Cl.
| | |
|---|---|
| *H01L 29/76* | (2006.01) |
| *H01L 29/94* | (2006.01) |
| *H01L 29/78* | (2006.01) |
| *H01L 29/66* | (2006.01) |
| *H01L 21/761* | (2006.01) |
| *H01L 21/8234* | (2006.01) |
| *H01L 29/10* | (2006.01) |
| *H01L 29/08* | (2006.01) |
| *H01L 29/06* | (2006.01) |
| *H01L 29/423* | (2006.01) |
| *H01L 27/088* | (2006.01) |

(52) U.S. Cl.
CPC ......... *H01L 29/7816* (2013.01); *H01L 29/1087* (2013.01); *H01L 29/0847* (2013.01); *H01L 29/0653* (2013.01); *H01L 29/66659* (2013.01); *H01L 29/4238* (2013.01); *H01L 29/1083* (2013.01); *H01L 21/761* (2013.01); *H01L 29/7835* (2013.01); *H01L 27/088* (2013.01); *H01L 21/823418* (2013.01); *H01L 29/0692* (2013.01)
USPC ........... 257/337; 257/335; 257/341; 257/342; 257/343; 438/270; 438/284

(58) Field of Classification Search
CPC . H01L 29/7835; H01L 29/7816; H01L 29/78; H01L 29/0692; H01L 21/761
USPC .................... 257/337, 335, 341–343; 438/270
See application file for complete search history.

(56) References Cited

U.S. PATENT DOCUMENTS

| | | | |
|---|---|---|---|
| 7,095,092 B2 | 8/2006 | Zhu et al. | |
| 7,279,768 B2 * | 10/2007 | Kanda et al. | .................. 257/491 |
| 2010/0314683 A1 * | 12/2010 | Yanagi | ........................... 257/339 |

FOREIGN PATENT DOCUMENTS

| | | |
|---|---|---|
| DE | 102 34 677 A1 | 2/2004 |
| JP | 2006-237223 A | 9/2006 |

OTHER PUBLICATIONS

Extended European Search Report dated Nov. 18, 2013, in European Patent Application No. 12193092.9.
R. Zhu et al., "A 65V, 0.56 mΩ.cm² Resurf LDMOS in a 0.35 μm CMOS Process", IEEE ISPSD2000, pp. 335-338, 2000.

* cited by examiner

*Primary Examiner* — Theresa T Doan
(74) *Attorney, Agent, or Firm* — Miles & Stockbridge P.C.

(57) ABSTRACT

In the interior of a semiconductor substrate having a main surface, a first p⁻ epitaxial region is formed, a second p⁻ epitaxial region is formed on the main surface side, and an n-type drift region and a p-type body region are formed on the main surface side. An n⁺ buried region is formed between the first p⁻ epitaxial region and the second p⁻ epitaxial region in order to electrically isolate the regions. A p⁺ buried region having a p-type impurity concentration higher than that of the second p⁻ epitaxial region is formed between the n⁺ buried region and the second p⁻ epitaxial region. The p⁺ buried region is located at least immediately under the junction between the n-type drift region and the p-type body region so as to avoid a site immediately under a drain region which is in contact with the n-type drift region.

5 Claims, 28 Drawing Sheets

SEMICONDUCTOR DEVICE

CROSS-REFERENCE TO RELATED APPLICATIONS

The disclosure of Japanese Patent Application No. 2011-258570 filed on Nov. 28, 2011 including the specification, drawings and abstract is incorporated herein by reference in its entirety.

BACKGROUND

The present invention relates to a semiconductor device, in particular to a semiconductor device having a lateral element.

A general structure of a lateral high-voltage MOS (Metal Oxide Semiconductor) transistor (LDMOS transistor) formed over a p⁻ epitaxial substrate is the structure of a RESURF (REduced SURface Field) type MOS transistor (refer to FIG. 1 in Non-patent Literature 1). In the structure, by optimizing an impurity concentration profile in an n-type drift region, a depletion layer expands even to a junction between the n-type drift region and a p⁻ epitaxial region thereunder when a reverse bias is applied and a high breakdown voltage can be obtained.

When a transistor of a structure where a source electrode (or a p-type body region) and a p⁻ epitaxial region are not electrically isolated from each other is used as a high-side element however, ground potential of the p⁻ epitaxial region is destabilized by being pulled by a source voltage applied to the source electrode and a low-side element malfunctions. Consequently, a problem here is that such a transistor cannot be used as a high-side element and is limited to the application as a low-side element.

To cope with the problem, as structures usable even as a high-side element, there are two types of structures each of which has an n-type isolation region for electrically isolating a p⁻ epitaxial region from a source electrode.

The first type has a configuration of forming an n-type isolation region stated above and then short-circuiting the n-type isolation region to a cathode region (refer to FIG. 1 in Patent Literature 1).

The second type has a configuration of forming an n-type isolation region stated above and then forming a p-type buried diffusion layer having a p-type impurity concentration higher than that of a p⁻ diffusion region so as to be in contact with the n-type isolation region (refer to FIG. 1 in Patent Literature 2).

PREVIOUS TECHNICAL LITERATURE

Patent Literature

[Patent Literature 1]
Specification of U.S. Pat. No. 7,095,092
[Patent Literature 2]
Japanese Unexamined Patent Publication No. 2006-237223

Non-Patent Literature

[Non-Patent Literature 1]
R. Zhu et al., "A 65V, 0.56 mΩ·cm2 Resurf LDMOS in a 0.35 μm CMOS Process", IEEE ISPSD2000, pp. 335-338

SUMMARY

In the structure of the first type however, since an n-type isolation region takes a cathode potential, when a reverse bias is applied, a depletion layer formed at a junction between the n-type isolation region and a p⁻ epitaxial region and a depletion layer formed at a junction between the p⁻ epitaxial region and an n-type drift region punch through in advance and potential difference is generated between the n-type isolation region and an anode region. Consequently, the problem here is that electric field concentration is caused in the vicinity of a junction between a p-type body region and the n-type drift region and the breakdown voltage comes to be lower than that of a RESURF structure not having an n-type isolation region stated earlier.

Then in the structure of the second type, an on-breakdown-voltage may possibly lower. The present invention has been established in view of the above problems and an object thereof is to provide a semiconductor device having fewer malfunctions and being capable of maintaining both an on-breakdown-voltage and an off-breakdown-voltage at high levels even when it is used as a high-side element.

A semiconductor device according to an embodiment of the present invention has: a semiconductor substrate; first, second, fourth, and sixth regions of a first conductivity type; and third and fifth regions and a drain region of a second conductivity type. The semiconductor substrate has a main surface. The first region is formed in the semiconductor substrate. The second region is formed on the main surface side of the first region in the semiconductor substrate. The third region is formed on the main surface side of the second region in the semiconductor substrate and configures a p-n junction with the second region. The fourth region is formed on the main surface side of the second region in the semiconductor substrate so as to be in contact with the second region and be adjacent to the third region and has a first conductivity type impurity concentration higher than that of the second region. The fifth region is formed in the semiconductor substrate between the first region and the second region so as to electrically isolate the first region from the second region. The sixth region is formed in the semiconductor substrate between the fifth region and the second region and has a first conductivity type impurity concentration higher than that of the second region. The drain region is formed over the main surface so as to be in contact with the third region and has a second conductivity type impurity concentration higher than that of the third region. The sixth region is located at least immediately under a junction between the third region and the fourth region so as to avoid a site immediately under the drain region.

In the present embodiment, the first region and second region of the first conductivity type are electrically isolated from each other by the fifth region of the second conductivity type. Consequently, it is possible to reduce malfunctions even when the semiconductor device is used as a high-side element.

Further, the sixth region having an impurity concentration higher than that of the second region is formed between the fifth region and the second region. By the sixth region, a depletion layer expanding from the p-n junction between the third region and the second region toward the second region side when a reverse bias is applied is inhibited from coupling with a depletion layer formed at a p-n junction between the fifth region and the sixth region. Consequently, punch through is inhibited from occurring, the concentration of an electric field at a junction between the third region and the fourth region can be alleviated, and resultantly an off-breakdown-voltage can be maintained at a high level. By locating the sixth region at least immediately under the junction between the third region and the fourth region, the sixth region can be located at a position least distant from the junction between the third region and the fourth region and hence the above effect can be enhanced further.

Moreover, by forming the sixth region so as to avoid a site immediately under the drain region, an on-breakdown-voltage can be inhibited from deteriorating.

DETAILED DESCRIPTION

Embodiments according to the present invention are hereunder explained in reference to drawings.

Embodiment 1

Figure 1:
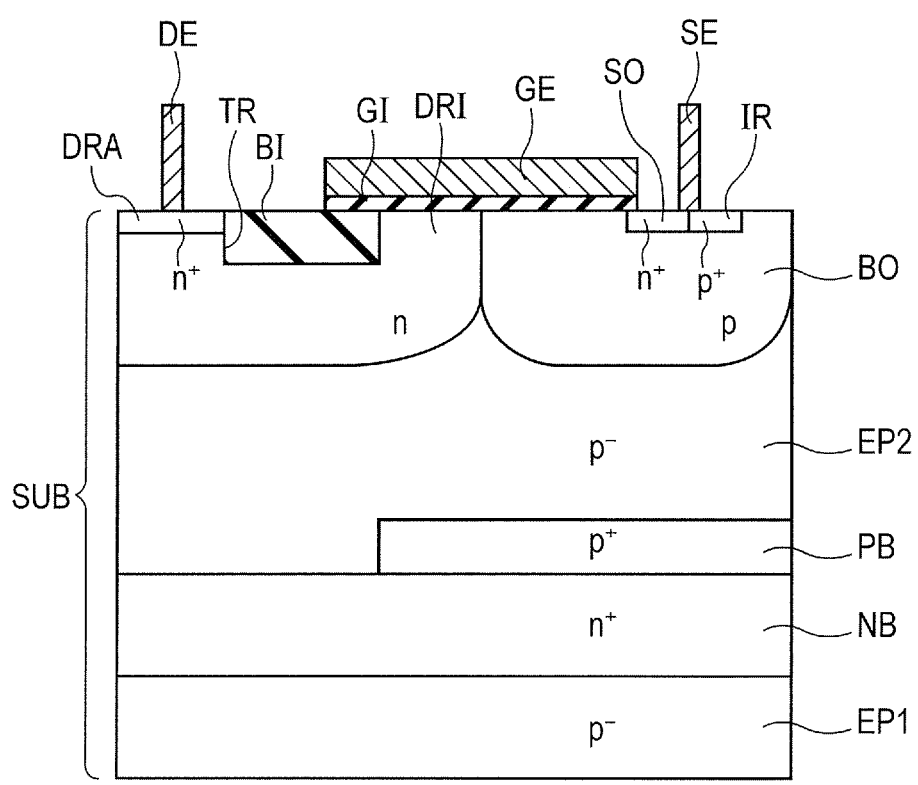
FIG. 1 is a sectional view schematically showing the configuration of a semiconductor device according to Embodiment 1 of the present invention.

Firstly, the configuration of a semiconductor device according to the present embodiment is explained in reference to FIG. 1.

In reference to FIG. 1, a semiconductor device according to the present embodiment has an LDMOS transistor (lateral insulation gate type field effect transistor) for example. The semiconductor device mostly has a semiconductor substrate SUB, a p⁻ epitaxial region (first region) EP1, an n⁺ buried region (fifth region) NB, a p⁺ buried region (sixth region) PB, a p⁻ epitaxial region (second region) EP2, an n-type drift region (third region) DRI, a p-type body region (fourth region) BO, an n⁺ drain region (drain region) DRA, an n⁺ source region SO, a gate insulation film GI, a gate electrode layer GE, and an STI structure TR and BI.

The semiconductor substrate SUB includes silicon for example. The semiconductor substrate SUB has a main surface (a plane on the upper side in the figure). The p⁻ epitaxial region EP1 is formed in the semiconductor substrate SUB.

The p⁻ epitaxial region EP2 is formed on the main surface side of the p⁻ epitaxial region EP1 in the semiconductor substrate SUB. The n-type drift region DRI is formed on the main surface side of the p⁻ epitaxial region EP2 in the semiconductor substrate SUB. The n-type drift region DRI configures a p-n junction extending in the direction along the main surface with the p⁻ epitaxial region EP2.

The p-type body region BO is formed on the main surface side of the p⁻ epitaxial region EP2 in the semiconductor substrate SUB. The p-type body region BO is formed so as to be in contact with the p⁻ epitaxial region EP2, configure a p-n junction with the n-type drift region DRI, and be adjacent to the n-type drift region DRI. The p-type body region BO has a p-type impurity concentration higher than that of the p⁻ epitaxial region EP2.

The STI structure TR and BI has a trench TR and an buried insulation film BI. The trench TR is formed in the n-type drift region DRI over the main surface of the semiconductor substrate SUB. The buried insulation film BI is formed so as to be buried into the trench TR.

The n⁺ drain region DRA is formed over the main surface of the semiconductor substrate SUB so as to be in contact with the n-type drift region DRI and has an n-type impurity concentration higher than that of the n-type drift region DRI. The n⁺ drain region DRA is located on the side of the STI structure TR and BI opposite to the p-type body region BO and formed so as to be adjacent to the STI structure TR and BI. A drain electrode DE is formed over the main surface of the semiconductor substrate SUB so as to be electrically coupled to the n⁺ drain region DRA.

The n⁺ source region SO is formed over the main surface of the semiconductor substrate SUB so as to configure a p-n junction with the p-type body region BO. Further, a p⁺ impurity region IR which is in contact with the n⁺ source region SO and having a p-type impurity concentration higher than that of the p-type body region BO is formed over the main surface of the semiconductor substrate SUB. A source electrode SE is formed over the main surface of the semiconductor substrate SUB so as to be electrically coupled to both the n⁺ source region SO and the p⁺ impurity region IR.

The gate electrode layer GE is formed over the p-type body region BO and the n-type drift region DRI interposed between the n⁺ drain region DRA and the n⁺ source region SO through the gate insulation film GI. A part of the gate electrode layer GE hangs over the STI structures TR and BI.

The n⁺ buried region NB is formed between the p⁻ epitaxial region EP1 and the p⁻ epitaxial region EP2. The n⁺ buried region NB is formed so as to configure a p-n junction with the p⁻ epitaxial region EP1 and electrically isolate the p⁻ epitaxial region EP1 from the p⁻ epitaxial region EP2.

The p⁺ buried region PB is formed between the n⁺ buried region NB and the p⁻ epitaxial region EP2. The p⁺ buried region PB has a p-type impurity concentration higher than that of the p⁻ epitaxial region EP2. The n⁺ buried region NB configures a p-n junction with the p⁺ buried region PB and also configures a p-n junction with the p⁻ epitaxial region EP2.

The p⁺ buried region PB is located at least immediately under a junction between the n-type drift region DRI and the p-type body region BO so as to avoid a site immediately under the drain electrode DE. That is, the p⁺ buried region PB is not allocated immediately under the drain electrode DE and the n⁺ buried region NB and the p⁻ epitaxial region EP2 are allocated so as to be in contact with each other. As long as the above conditions are satisfied, the p⁺ buried region PB may be allocated also immediately under the source electrode SE as shown in FIG. 1 for example.

In the above case, the LDMOS transistor has an n-type drift region DRI, a p-type body region BO, an n⁺ drain region DRA, an n⁺ source region SO, a gate insulation film GI, and a gate electrode layer GE.

Figure 2:
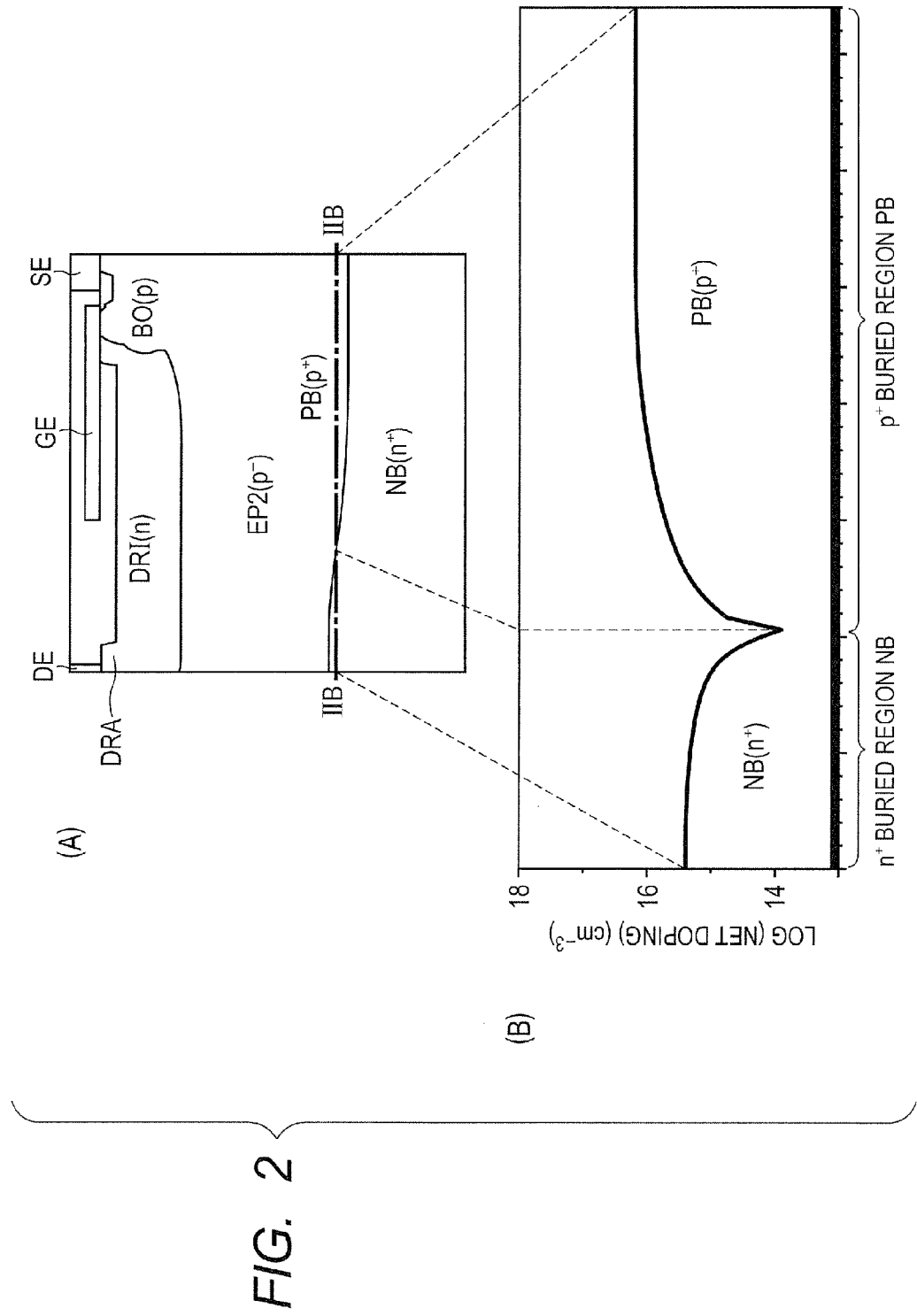
FIG. 2A is a view of a model showing the configuration of a semiconductor device according to Embodiment 1 of the present invention as a state of impurity diffusion.
FIG. 2B is a view showing an impurity concentration distribution take on the dashed-dotted line IIB-IIB of FIG. 2A.

An impurity concentration distribution in regions in the semiconductor device of FIG. 1 is explained hereunder in reference to FIGS. 2A and 2B.

FIG. 2A shows a diffusion state of impurities in a region in the vicinity of a boundary between a region where a p⁺ buried region PB is allocated so as to be in contact with an n⁺ buried region NB and a region where a p⁺ buried region PB is not allocated particularly in the structure shown in FIG. 1 and FIG. 2B shows a one-dimensional profile of an impurity concentration distribution in the region in the vicinity of the boundary.

That is, the curved line shown with the solid line in FIG. 2B shows the impurity concentration distribution in the region shown with the dashed-dotted line in FIG. 2A. The vertical axis of FIG. 2B represents a logarithmic value of Net Doping and the horizontal axis represents a position in a semiconductor substrate SUB.

In reference to FIG. 2B, in the impurity concentration distribution in the direction parallel with the main surface of a semiconductor substrate SUB passing through a region where a p⁺ buried region PB is formed, the region where the p⁺ buried region PB is formed has a p-type impurity concentration of about $1 \times 10^{16}$ cm⁻³ for example. Further, an inflection point where the impurity concentration is very low (about $1 \times 10^{14}$ cm$^{-3}$) in comparison with other regions exists at a boundary between a region where the p$^+$ buried region PB is allocated and a region where the p$^+$ buried region PB is not allocated. With the inflection point almost as the boundary, a region of a high p-type impurity concentration including the p$^+$ buried region PB exists on the right side in the figure and a region of a high n-type impurity concentration caused by the diffusion formed so that an n$^+$ buried region NB may build up on the side of the drain electrode DE (on the upper side in the figure) exists on the left side in the figure. Consequently, the curved line of the impurity concentration takes such a shape as shown in the figure.

Here, the reason why an inflection point having a low impurity concentration appears at a boundary between a region where a p$^+$ buried region PB is allocated so as to be in contact with an n$^+$ buried region NB and a region where a p$^+$ buried region PB is not allocated is that n-type impurities in the n$^+$ buried region NB and p-type impurities in the p$^+$ buried region PB are compensated with each other. The position of an end of a p$^+$ buried region PB immediately under a drain region can be identified from the position of the inflection point. In the present embodiment, the inflection point is located on the side of a position immediately under a junction between an n-type drift region DRI and a p-type body region BO rather than a region immediately under a drain region DRA.

An array of LDMOS transistors one of which is shown in FIG. 1 is hereunder explained in reference to FIGS. 3A, 3B, 4A, and 4B.

Figure 3:
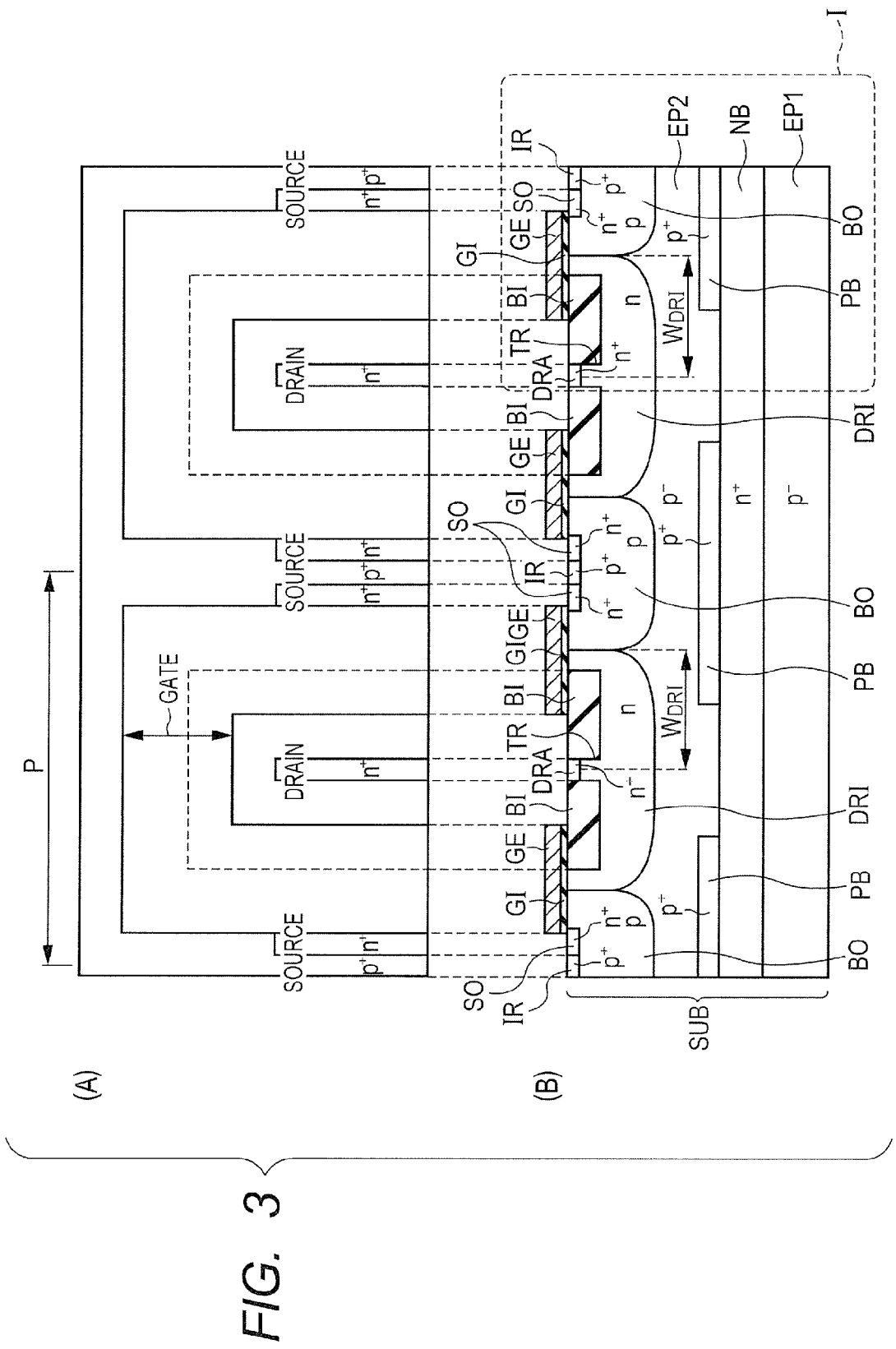
FIG. 3A is a plan view and FIG. 3B is a sectional view schematically showing the configuration of a unit part in the first example of an array of semiconductor devices one of which is shown in FIG. 1.

In reference to FIGS. 3A and 3B, in the first example of an array of LDMOS transistors, the circumference of an n$^+$ drain region DRA is surrounded by a gate electrode GE over the main surface of a semiconductor substrate SUB and n$^+$ source regions SO are allocated on both the sides of the n$^+$ drain region DRA. The region I surrounded by the dotted line in FIGS. 3A and 3B corresponds to the configuration of FIG. 1.

Figure 4:
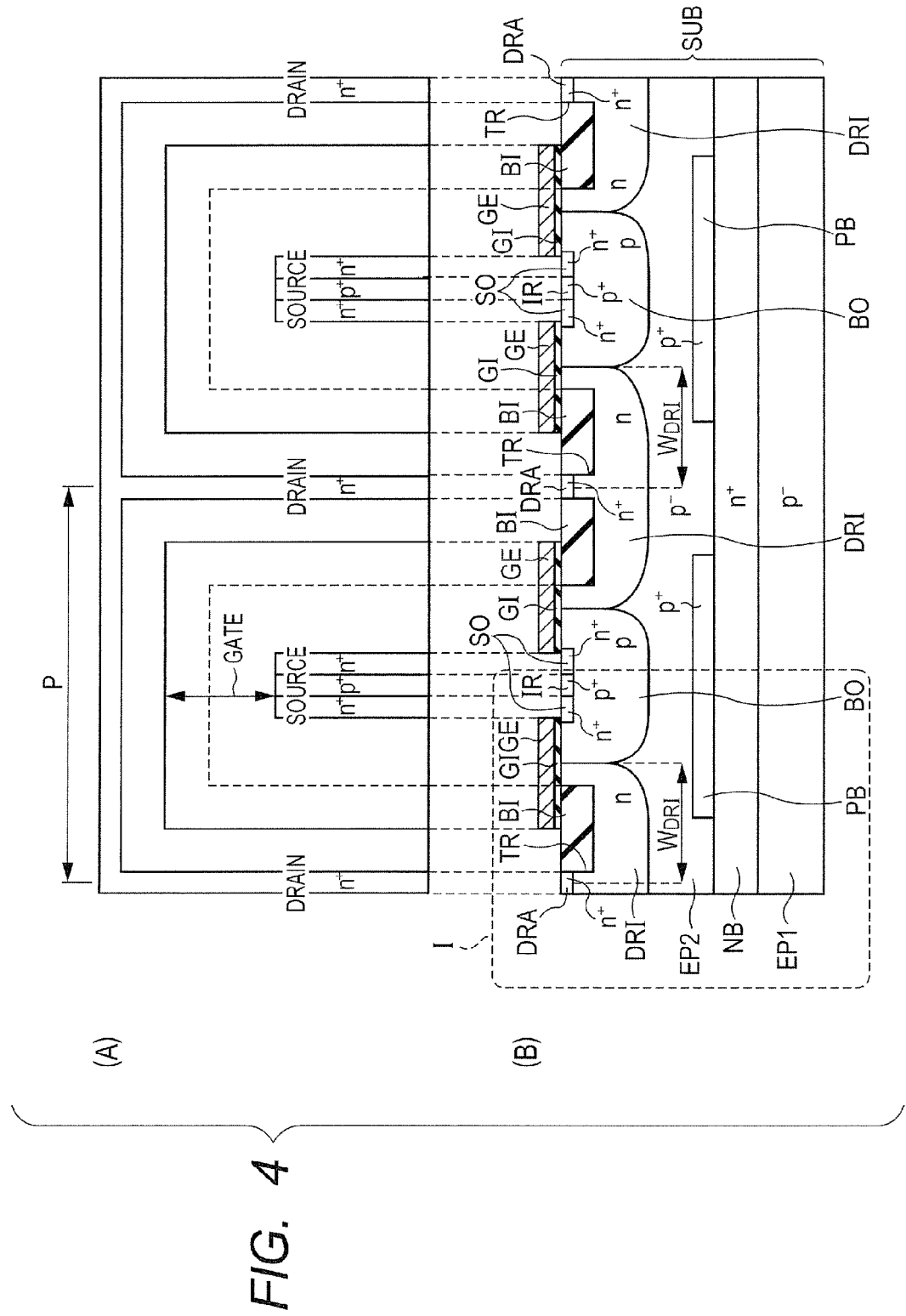
FIG. 4A is a plan view and FIG. 4B is a sectional view schematically showing the configuration of a unit part in the second example of an array of semiconductor devices one of which is shown in FIG. 1.
Figure 5:
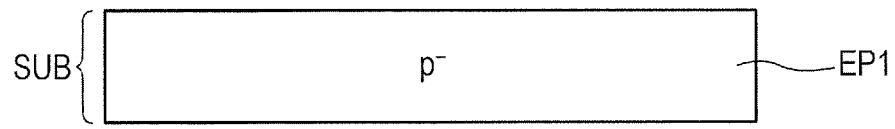
FIG. 5 is a schematic sectional view showing the first process in a manufacturing method of a semiconductor device according to Embodiment 1 of the present invention.

In reference to FIGS. 4A and 4B, in the second example of an array of LDMOS transistors, the circumference of n$^+$ source regions SO is surrounded by a gate electrode GE and an n$^+$ drain region DRA over the main surface of a semiconductor substrate SUB. Here, the region I surrounded by the dotted line in FIGS. 4A and 4B corresponds to the configuration of FIG. 1. In each of FIGS. 3A and 4A, an array is configured by repeating the configuration in the range shown by the pitch P in each of the figures several times in the direction parallel with the main surface.

A manufacturing method according to the present embodiment is hereunder explained in reference to FIGS. 5 to 11 and FIG. 1. In reference to FIG. 5, firstly a p$^-$ epitaxial region EP1 is formed in a semiconductor substrate SUB by epitaxial growth.

Figure 6:
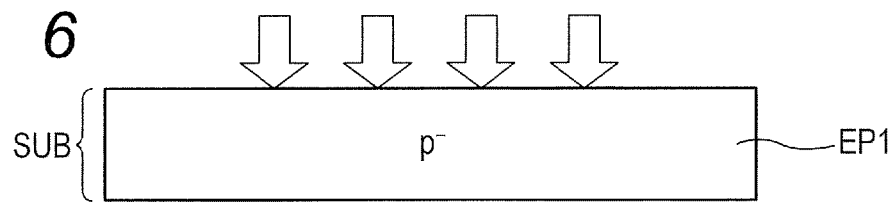
FIG. 6 is a schematic sectional view showing the second process in the manufacturing method of a semiconductor device according to Embodiment 1 of the present invention.

In reference to FIG. 6, n-type ions are implanted through the surface of the p$^-$ epitaxial region EP1 by an ion implantation method.

Figure 7:
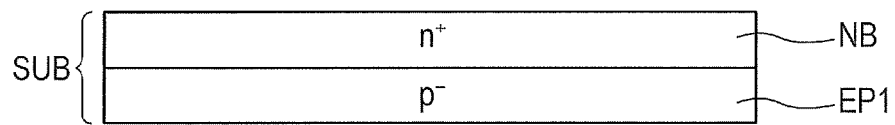
FIG. 7 is a schematic sectional view showing the third process in the manufacturing method of a semiconductor device according to Embodiment 1 of the present invention.

In reference to FIG. 7, an n$^+$ buried region NB is formed over the surface of the p$^-$ epitaxial region EP1 by applying annealing and diffusing the n-type ions implanted into the p$^-$ epitaxial region EP1.

Figure 8:
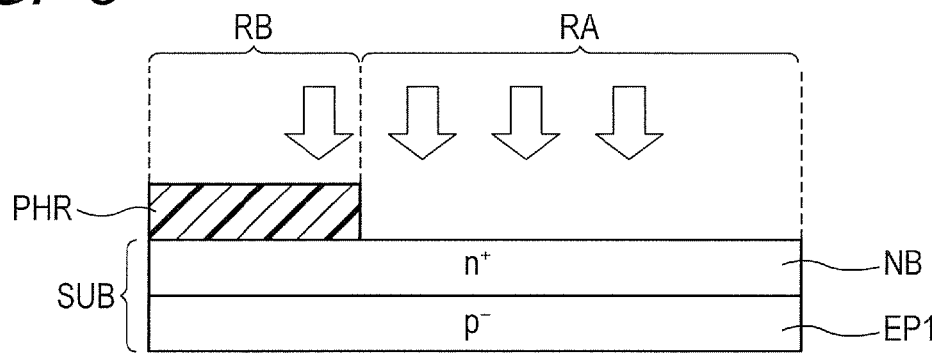
FIG. 8 is a schematic sectional view showing the fourth process in the manufacturing method of a semiconductor device according to Embodiment 1 of the present invention.

In reference to FIG. 8, a photoresist pattern PHR is formed over the surface of the n$^+$ buried region NB by an ordinary photoengraving technology. Successively, p-type ions are implanted through the surface of the n$^+$ buried region NB by an ion implantation method with the photoresist pattern PHR as a mask. On this occasion, the p-type ions are implanted only in a region RA selectively to the surface of the n$^+$ buried region with the photoresist pattern PHR. Successively, the photoresist PHR is removed by ashing or the like for example.

Figure 9:
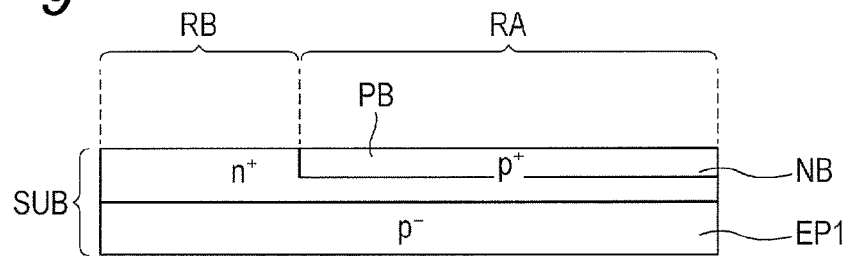
FIG. 9 is a schematic sectional view showing the fifth process in the manufacturing method of a semiconductor device according to Embodiment 1 of the present invention.

In reference to FIG. 9, a p$^+$ buried region PB is formed over the surface of the n$^+$ buried region NB by implanting p-type ions or the like. Specifically, a p$^+$ buried region PB is not formed in a region RB covered with the photoresist pattern PHR but is formed in the region RA where the photoresist pattern PHR is not formed.

Figure 10:
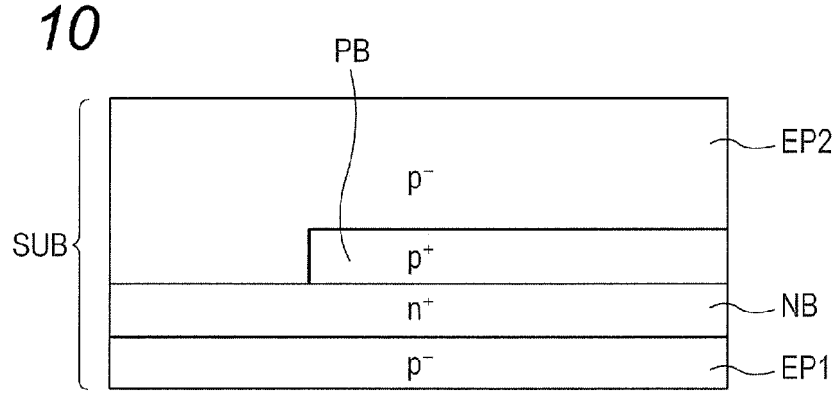
FIG. 10 is a schematic sectional view showing the sixth process in the manufacturing method of a semiconductor device according to Embodiment 1 of the present invention.

In reference to FIG. 10, a p$^-$ epitaxial region EP2 is formed over the p$^+$ buried region PB and the n$^+$ buried region NB by epitaxial growth. The p$^-$ epitaxial region EP2 is formed so as to surround the side of the p$^+$ buried region PB.

Figure 11:
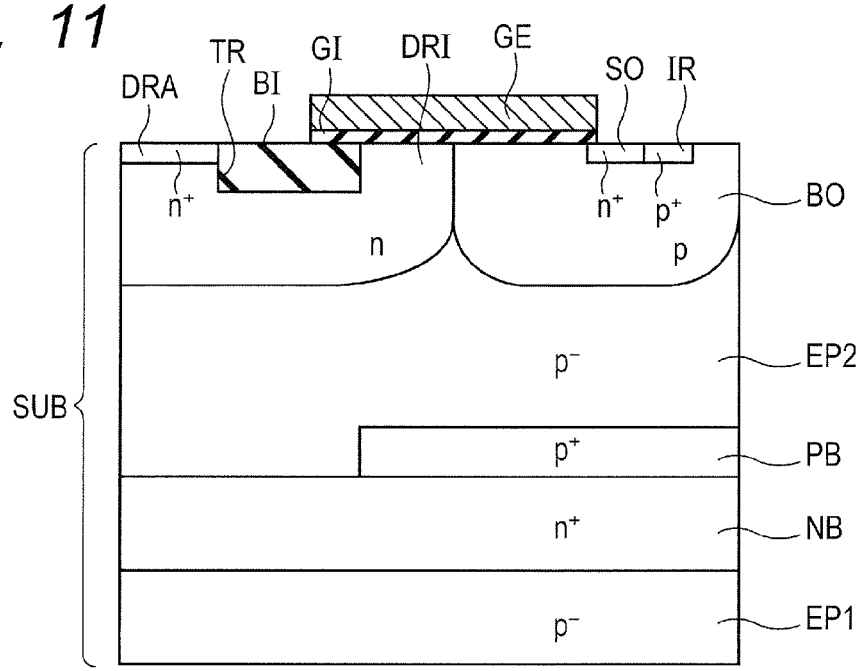
FIG. 11 is a schematic sectional view showing the seventh process in the manufacturing method of a semiconductor device according to Embodiment 1 of the present invention.

In reference to FIG. 11, successively, an n-type drift region DRI, a p-type body region BO, an n$^+$ drain region DRA, an n$^+$ source region SO, a p$^+$ impurity region IR, an STI structure TR and BI, a gate insulation film GI, a gate electrode GE, etc. are formed. Successively, a drain electrode DE and a source electrode SE are formed and a semiconductor device according to the present embodiment shown in FIG. 1 is manufactured.

Function effects in the present embodiment are explained hereunder in reference to FIGS. 12 to 29 in comparison with Comparative Examples 1 to 3.

Figure 12:
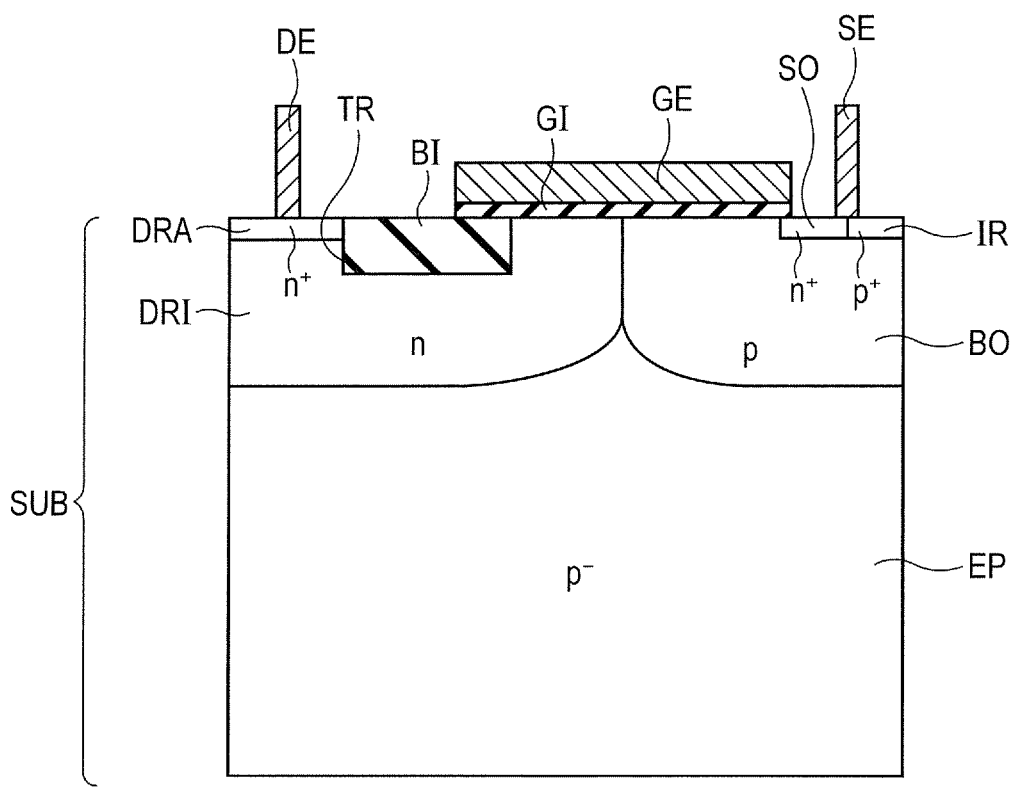
FIG. 12 is a sectional view schematically showing the configuration of Comparative Example 1.
Figure 13:
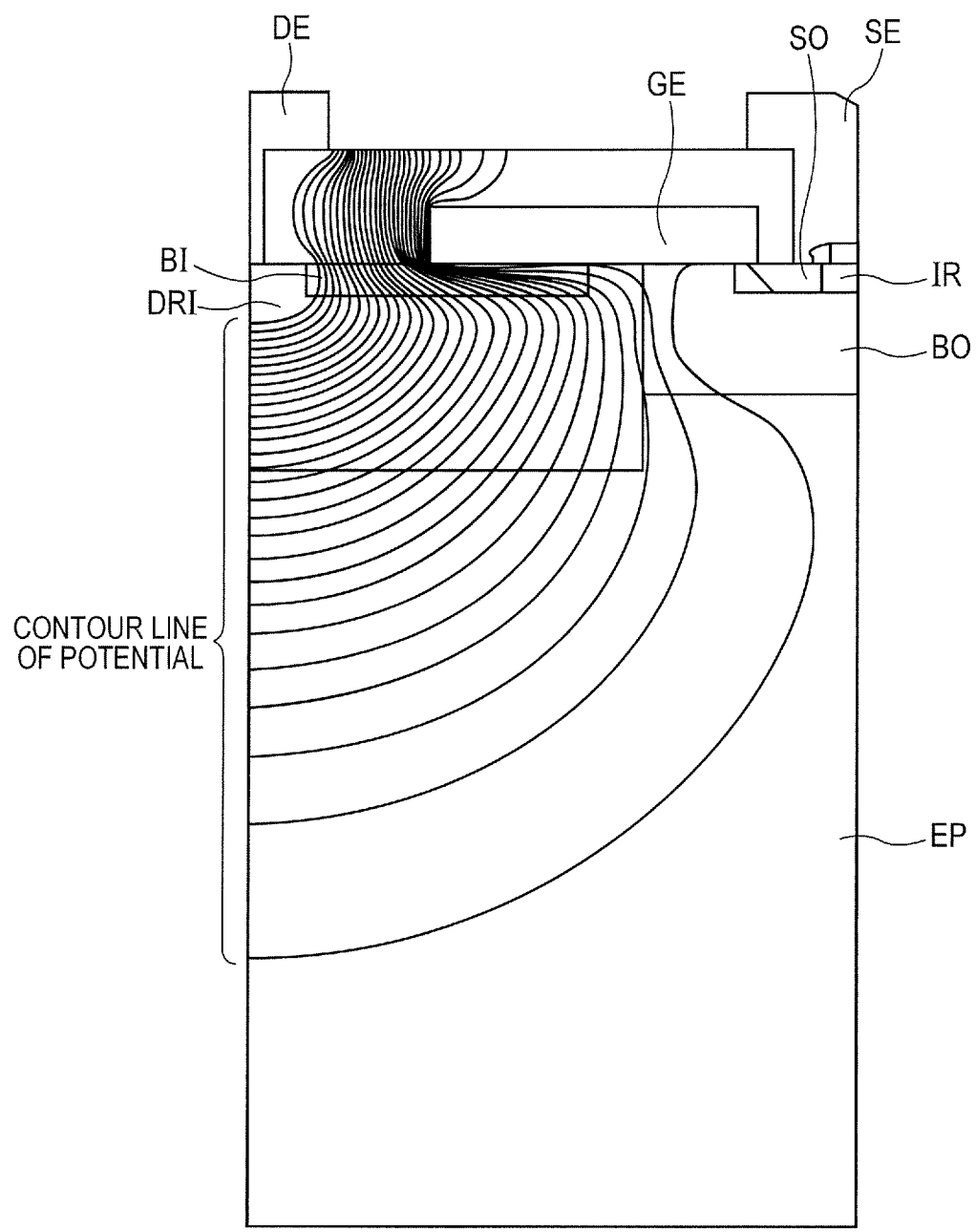
FIG. 13 is a view showing potential in a breakdown state in the structure of Comparative Example 1.
Figure 16:
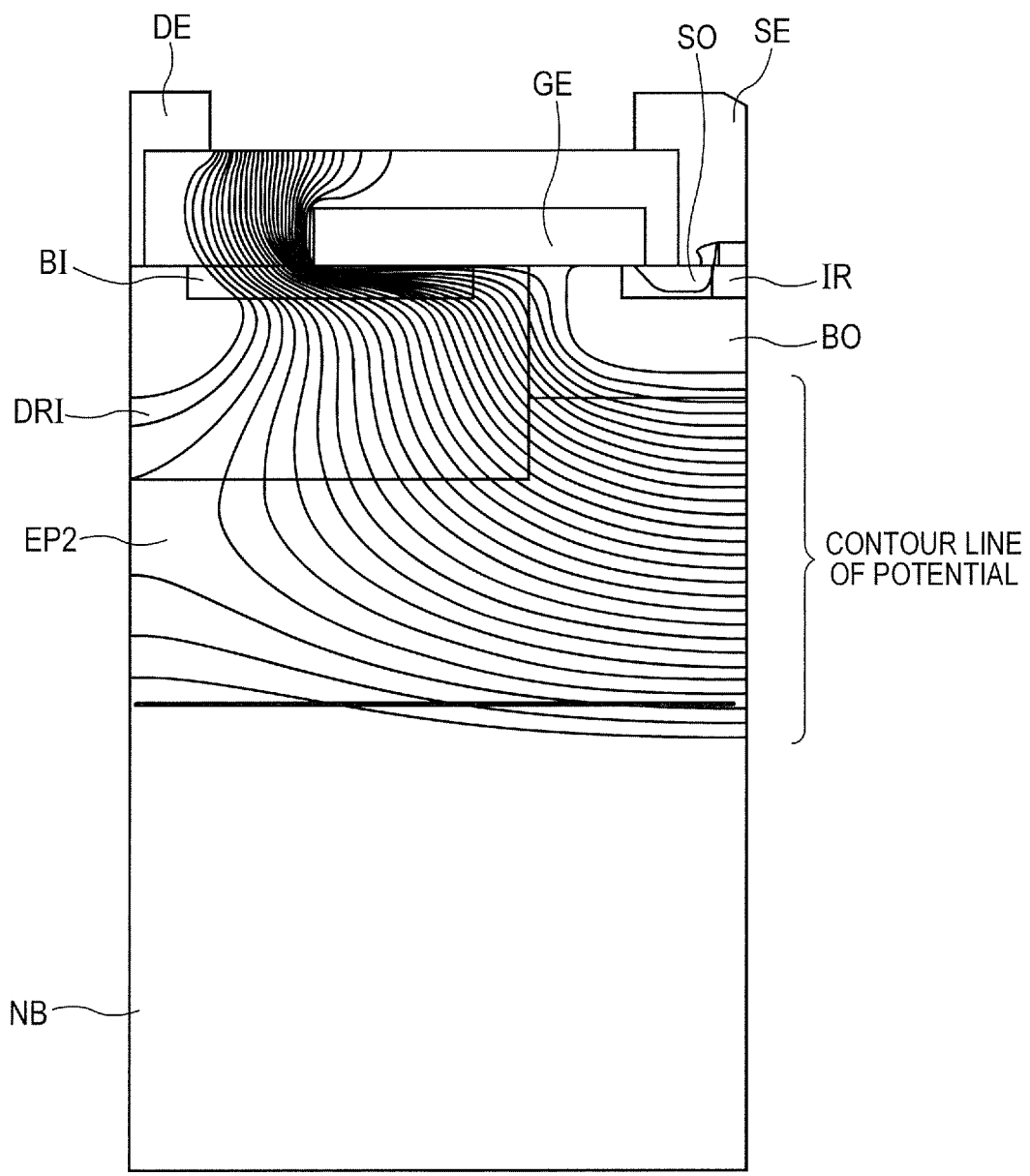
FIG. 16 is a view showing potential in a breakdown state in the structure of Comparative Example 2.

Comparative Example 1 shown in FIG. 12 has a configuration formed by omitting an n$^+$ buried region NB and a p$^+$ buried region PB from the configuration of the present embodiment shown in FIG. 1. Comparative Example 1 has a RESURF structure by bringing an n-type drift region DRI into contact with a p$^-$ epitaxial region EP from above. Consequently, in the state where a reverse bias is applied to the p$^-$ epitaxial region EP and the n-type drift region DRI and breakdown occurs (hereunder referred to merely as a breakdown state), a depletion layer expands in the p$^-$ epitaxial region EP under the n-type drift region DRI as shown in FIG. 13 and a high breakdown voltage can be obtained. Here, a plurality of curved lines shown in FIG. 13 are contour lines of potential (electric potential) in a depletion layer and a plurality of curved lines shown in FIG. 16 are the same. In the figure, a region where contour lines of potential expand means that a depletion layer expands.

A problem in the configuration of Comparative Example 1 however is that a source electrode SE (or a p-type body region BO) is not electrically isolated from a p$^-$ epitaxial region EP and hence the configuration is hardly usable as a high-side element.

Figure 14:
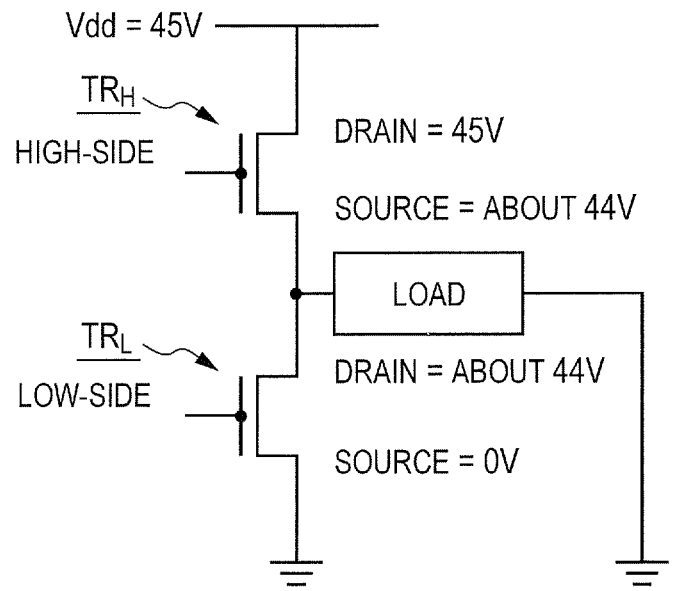
FIG. 14 is a circuit diagram for explaining a high-side element and a low-side element.

That is, in the case where a transistor of Comparative Example 1 shown in FIG. 12 is used as a high-side element TR$_H$ in FIG. 14, when a power supply potential Vdd of 45 V for example is applied to a drain of the transistor TR$_H$, a potential of about 44 V is applied to a source. Here, in the transistor of Comparative Example 1 shown in FIG. 12, a source electrode SE (or a p-type body region BO) is not electrically isolated from a p$^-$ epitaxial region EP. Consequently, when the Source potential of the transistor TR$_H$ is 44 V and "High", a ground potential (GND) that is the potential of a substrate electrically coupled to the p$^-$ epitaxial region EP is destabilized. When the ground potential is destabilized, the potential of a source (back gate) that is the ground potential of a low-side element TR$_L$ shown in FIG. 14 is also destabilized and the low-side element TR$_L$ malfunctions.

Figure 15:
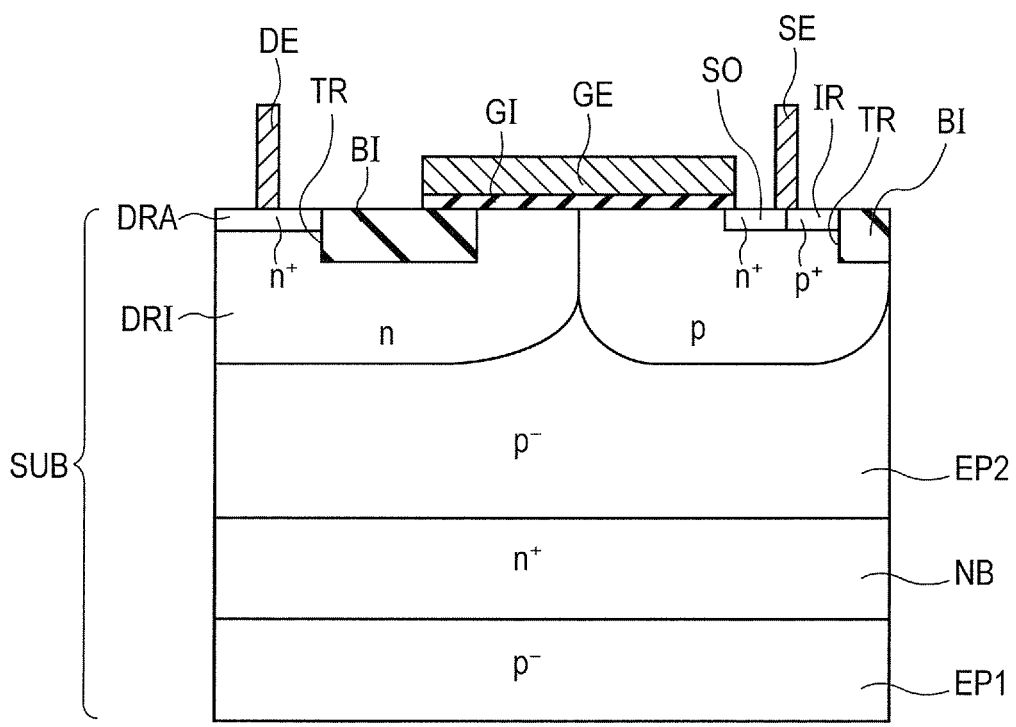
FIG. 15 is a sectional view schematically showing the configuration of Comparative Example 2.

In this context, as a configuration of forming an n-type isolation region for electrically isolating a p$^-$ epitaxial region from a source electrode (or p-type body region), Comparative Example 2 shown in FIG. 15 is proposed for example. Comparative Example 2 shown in FIG. 15 has a configuration of foaming an n$^+$ buried region NB as an n-type isolation region.

In the configuration of Comparative Example 2, in a breakdown state, a depletion layer formed at a junction between an n+ buried region NB and a p− epitaxial region EP2 and a depletion layer formed at a junction between the p− epitaxial region EP2 and an n-type drift region DRI may cause punch through in advance in some cases as shown in FIG. 16. On this occasion, potential difference is caused between the n+ buried region NB and an n+ source region SO. As a result, electric field concentration is caused in the vicinity of a junction between a p-type body region BO and the n-type drift region DRI and hence breakdown voltage of Comparative Example 2 is lower than that of Comparative Example 1.

The change of the value of a specific on-resistance when an off-breakdown-voltage is changed in the configuration of Comparative Example 2 in FIG. 15 is investigated by simulation. The results are shown in FIG. 17.

Figure 17:
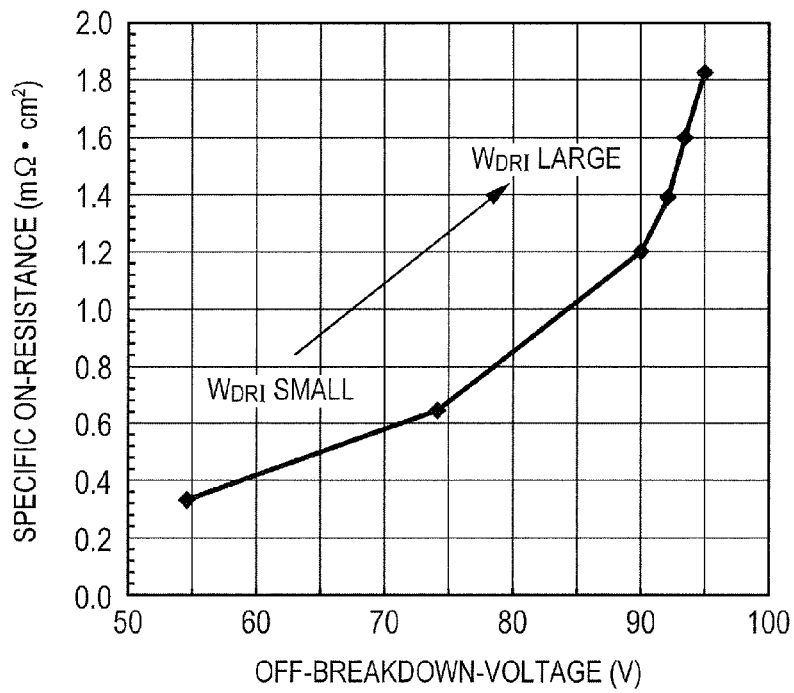
FIG. 17 is a graph showing the relationship between an off-breakdown-voltage and a specific on-resistance in the structure of FIG. 15.

In reference to FIG. 17, as $W_{DRI}$ (refer to FIGS. 3A, 3B and 4A, 4B) that is the width of a region particularly contributing to electric current between an n+ source region SO and an n+ drain region DRA in an n-type drift region DRI of FIG. 15 increases, a specific on-resistance increases and an off-breakdown-voltage also increases. That is, they are in the relationship of trade-off. The reason is that, by expanding the width of an n-type drift region DRI, a region of the n-type drift region DRI where a depletion layer expanding from the p− epitaxial region EP2 can converge expands when a reverse bias is applied to the p− epitaxial region EP2 and the n-type drift region DRI.

If an off-breakdown-voltage exceeds a prescribed value (about 90 V for example) however, even though the width of an n-type drift region DRI is expanded, the off-breakdown-voltage does not increase much and the increase of a specific on-resistance comes to be conspicuous. Because the specific on-resistance increases excessively to the off-voltage, the off-breakdown-voltage hardly increases anymore. The reason why an off-breakdown-voltage cannot increase is as follows.

As stated above, in the configuration of FIG. 15, a depletion layer formed at a junction between an n+ buried region NB and a p− epitaxial region EP2 and a depletion layer formed at a junction between the p− epitaxial region EP2 and an n-type drift region DRI may cause punch through in some cases. On this occasion, since the two depletion layers extending in the p− epitaxial region EP2 collide with each other, the depletion layers cannot extend anymore and breakdown voltage cannot be increased further. As a result, the increase of off-breakdown-voltage is suppressed and electric field concentration is caused in the vicinity of a junction between a p-type body region BO and the n-type drift region DRI.

Figure 18:
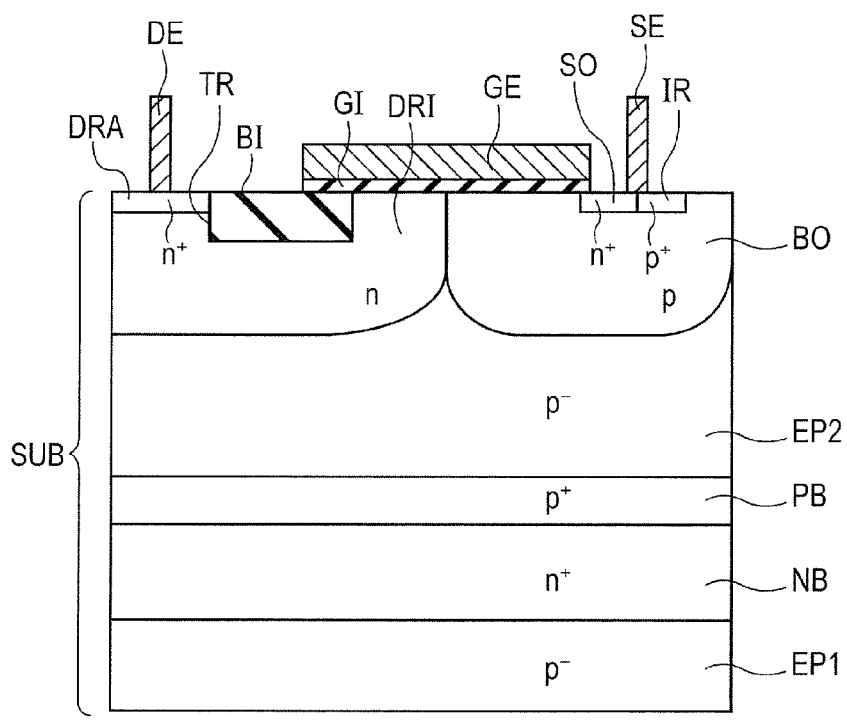
FIG. 18 is a sectional view schematically showing the configuration of Comparative Example 3.
Figure 19:
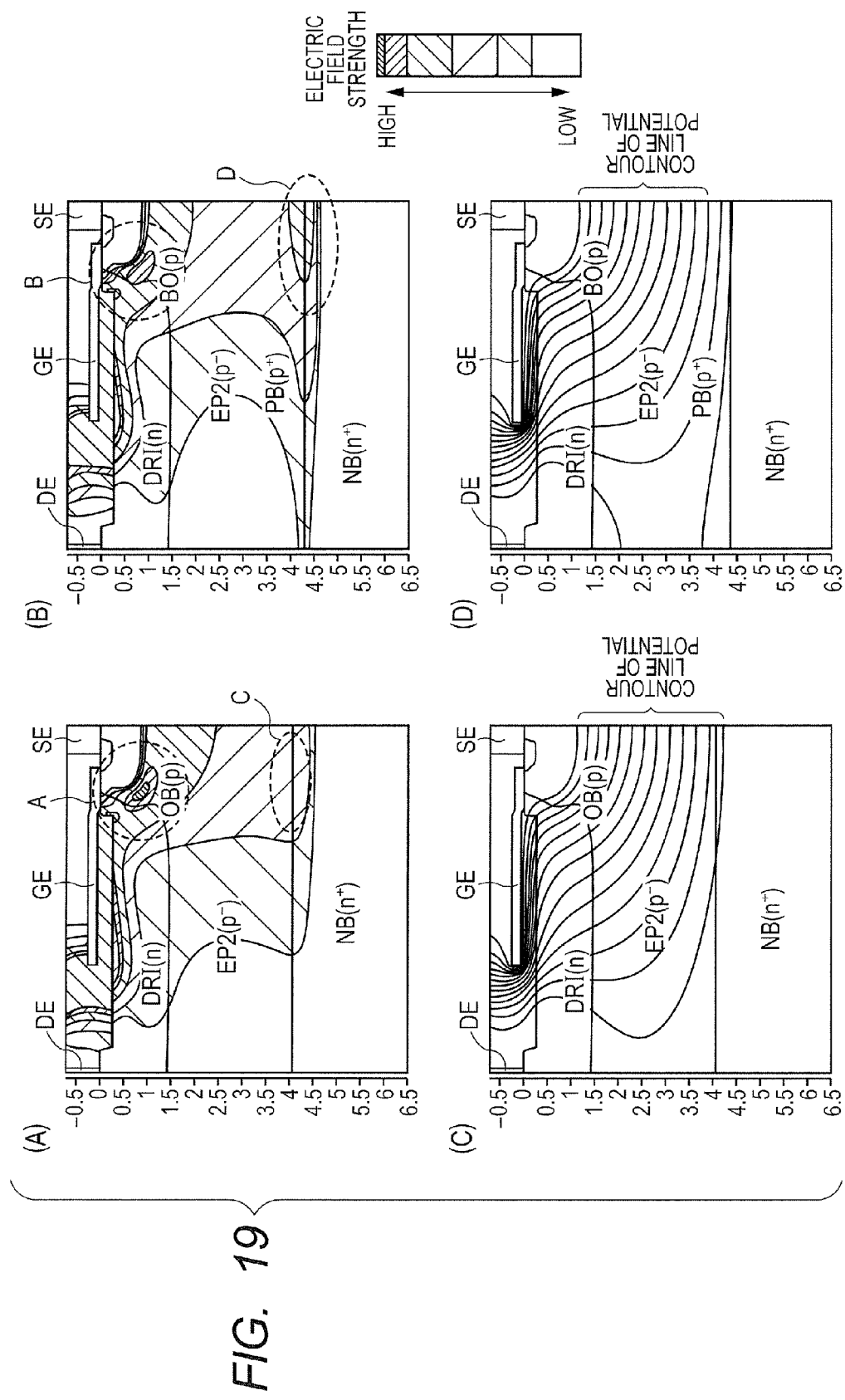
FIG. 19A is a view showing an electric field intensity distribution in a breakdown state in the configuration of Comparative Example 2.
FIG. 19B is a view showing an electric field intensity distribution in a breakdown state in the configuration of Comparative Example 3.
FIG. 19C is a view showing potential in a breakdown state in the configuration of Comparative Example 2.
FIG. 19D is a view showing potential in a breakdown state in the configuration of Comparative Example 3.

Comparative Example 3 shown in FIG. 18 has a configuration formed by adding an n+ buried region NB similar to Comparative Example 2 in FIG. 15 and a p+ buried region PB formed so as to be in contact with the top face of the n+ buried region NB to the configuration of Comparative Example 1 shown in FIG. 12. On this occasion, since the p+ buried region PB has a p-type impurity concentration higher than that of a p− epitaxial region EP2, a high electric field region is caused in the vicinity of a junction between the p+ buried region PB and the n+ buried region NB. With this, the potential at a source electrode SE (or a p-type body region BO) in FIG. 18 comes to be higher than the potential at a source electrode SE (or a p-type body region BO) in FIG. 12 or 15 for example. As a result, the electric field in the vicinity of a junction between the p-type body region BO and an n-type drift region DRI in FIG. 18 is lower than the electric field in the vicinity of a junction between a p-type body region BO and an n-type drift region DRI in FIG. 12 or 15.

Further, a junction between a p+ buried region PB and an n+ buried region NB in FIG. 18 shifts to the side lower than a junction between a p− epitaxial region EP2 and an n+ buried region NB (to the side of a p− epitaxial region EP1) in FIG. 15 for example. Consequently, a distance allowing a depletion layer caused at a junction between the n+ buried region NB and a p− epitaxial region EP2 (p+ buried region PB) to extend increases and an off-breakdown-voltage can be increased.

Distributions of electric field strengths at breakdown in the structure of FIG. 15 (Comparative Example 2) and the structure of FIG. 18 (Comparative Example 3) are investigated. The result in the structure of FIG. 15 is shown in FIG. 19A and the result in the structure of FIG. 18 is shown in FIG. 19B, respectively. Further, contour lines of potential at breakdown in the structure of FIG. 15 (Comparative Example 2) and the structure of FIG. 18 (Comparative Example 3) are shown in FIGS. 19C and 19D.

As a result of FIG. 19A, it is obvious that electric field concentrates more at a junction between an n-type drift region DRI and a p-type body region BO (region A surrounded by the dotted line in the figure) in a configuration of not installing a p+ buried region PB as shown in FIG. 15 than at a junction between an n-type drift region DRI and a p-type body region BO (region B surrounded by the dotted line in the figure) in a configuration of installing a p+ buried region PB as shown in FIG. 19B. On the other hand, electric field at a junction between a p− epitaxial region EP2 and an n+ buried region NB (region C surrounded by the dotted line in the figure) in FIG. 19A is low.

From the result of FIG. 19B in contrast, it is obvious that, by installing a p+ buried region PB as shown in FIG. 18, the concentration of electric field disperses to a junction between an n-type drift region DRI and a p-type body region BO (region B surrounded by the dotted line in the figure) and a junction between a p+ buried region PB and an n+ buried region NB (region D surrounded by the dotted line in the figure). Consequently, it is obvious that, by installing a p+ buried region PB as shown in FIG. 18, the concentration of electric field at a junction between an n-type drift region DRI and a p-type body region BO (region A in FIG. 19A and region B in FIG. 19B) can be alleviated.

Then the present inventors have investigated whether or not off-breakdown-voltage can be improved by forming a p+ buried region PB like Comparative Example 3 through simulation. The results are shown in FIG. 20.

Figure 20:
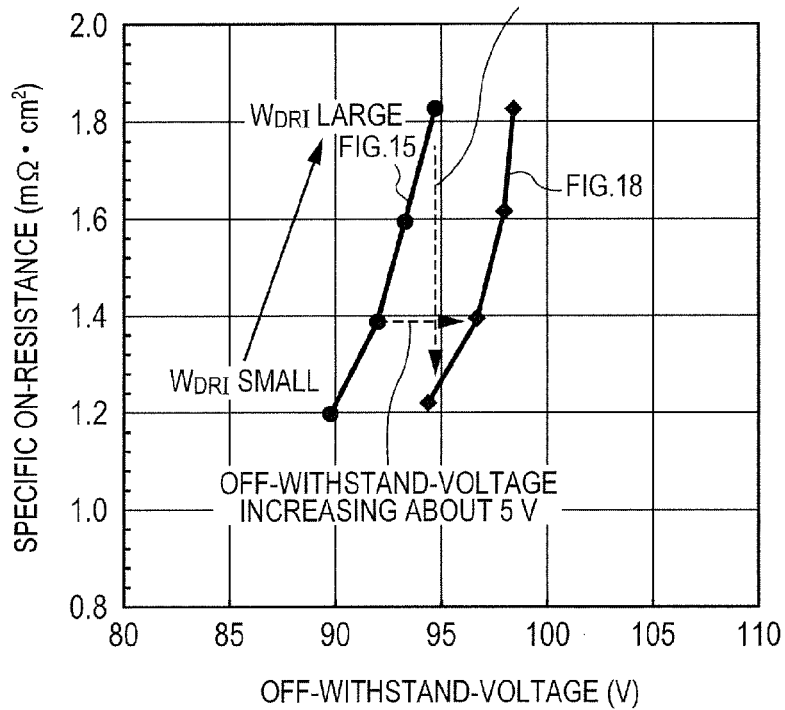
FIG. 20 is a graph showing the relationship between an off-breakdown-voltage and a specific on-resistance in the configurations of Comparative Examples 2 and 3.

In reference to FIG. 20, when an off-breakdown-voltage is set at 95 V, a specific on-resistance in Comparative Example 3 shown in FIG. 18 is about 1.2 mΩ·cm² and decreases by about 30% from about 1.8 mΩ·cm² in Comparative Example 2 shown in FIG. 15. Further, when a specific on-resistance is set at 1.4 mΩ·cm², whereas the off-breakdown-voltage is about 92 V in Comparative Example 2 of FIG. 15, the off-breakdown-voltage is about 97 V in Comparative Example 3 shown in FIG. 18 and increases about 5 V from Comparative Example 2.

From the above result, it can be said that it is possible to alleviate an electric field at a junction between an n-type drift region DRI and a p-type body region BO and improve off-breakdown-voltage by allocating a p+ buried region PB.

Effects of the allocation of a p+ buried region PB on on-breakdown-voltage are described hereunder.

The present inventors have investigated the relationship between an on-breakdown-voltage and a specific on-resistance in the structure of FIG. 15 (Comparative Example 2) and the structure of FIG. 18 (Comparative Example 3). The results are shown in FIG. 21.

Figure 21:
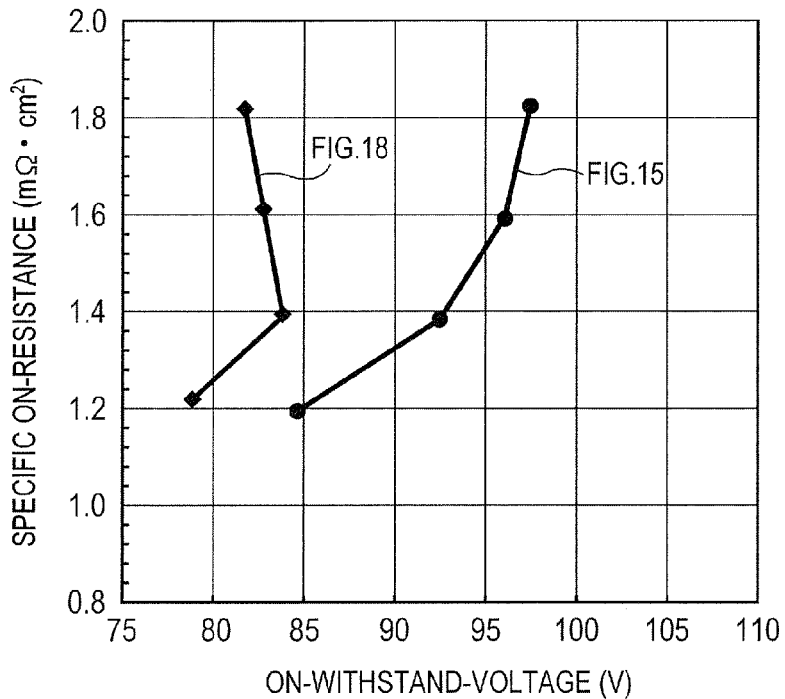
FIG. 21 is a graph showing the relationship between an on-breakdown-voltage and a specific on-resistance in the configurations of Comparative Examples 2 and 3.

In reference to FIG. 21, whereas the structure of FIG. 15 (Comparative Example 2) shows a trade-off characteristic of increasing a specific on-resistance in proportion to the increase of on-breakdown-voltage, in the structure of FIG. 18 (Comparative Example 3), the value of on-breakdown-voltage never exceeds about 83 V and rather decreases in proportion to the increase of the specific on-resistance in the region where the specific on-resistance is not less than 1.4 mΩ·cm². Further, it has been found that the on-breakdown-voltage in the structure of FIG. 18 is lower than that in the structure of FIG. 15 regardless of the value of specific on-resistance.

Figure 22:
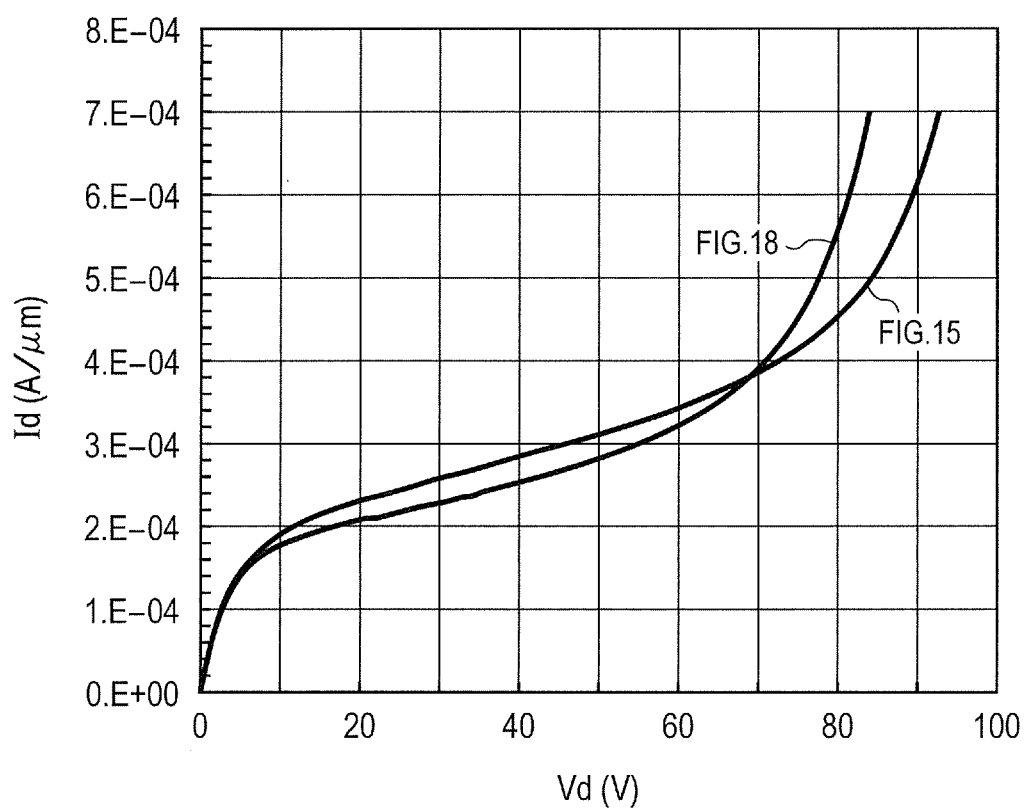
FIG. 22 is a graph showing the relationship between a drain voltage and a drain current in the configurations of Comparative Examples 2 and 3.
Figure 23:
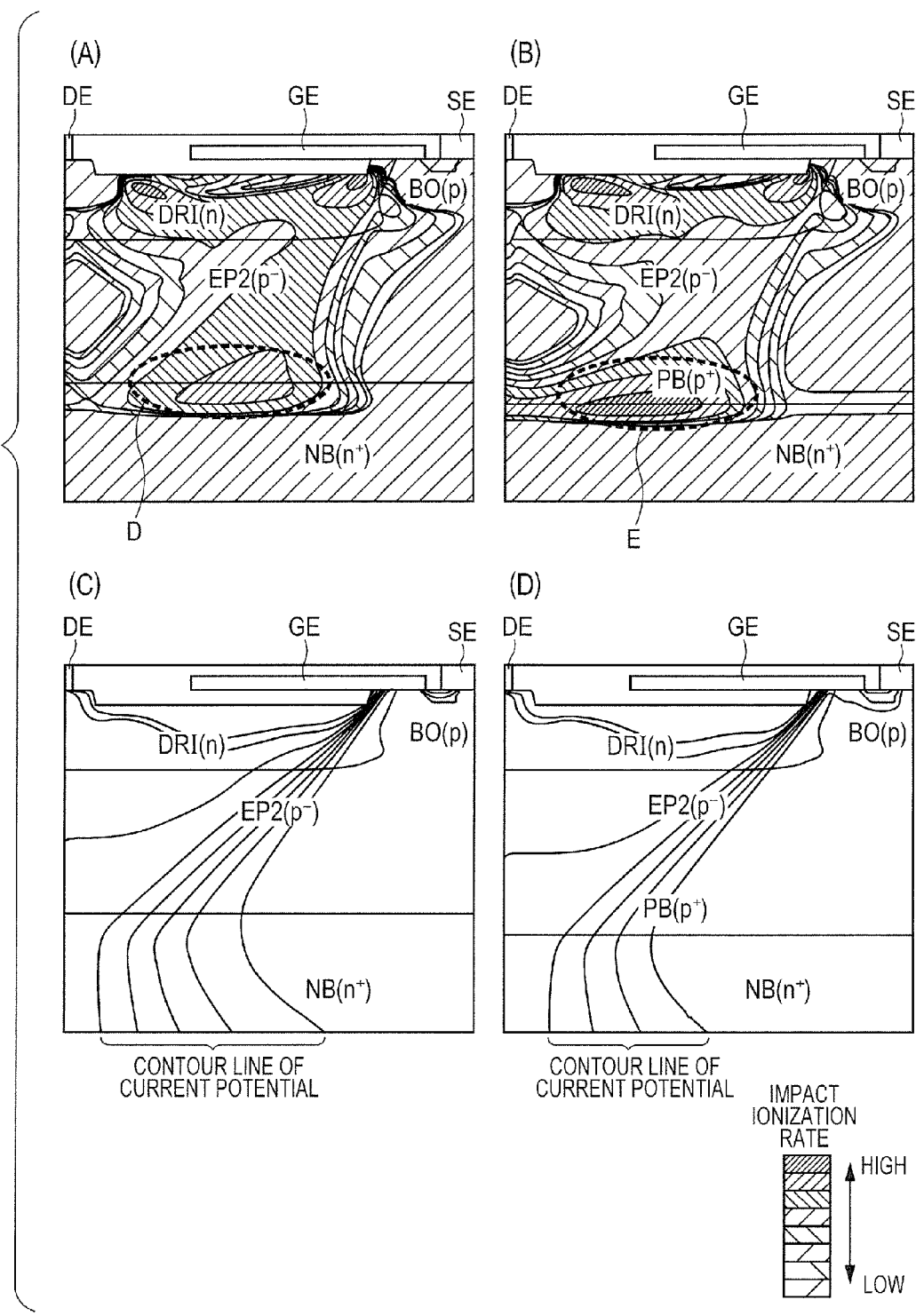
FIG. 23A is a view showing impact ionization rates in an on-state in the configuration of Comparative Example 2.
FIG. 23B is a view showing impact ionization rates in an on-state in the configuration of Comparative Example 3.
FIG. 23C is a view showing a current distribution in an on-state in the configuration of Comparative Example 2.
FIG. 23D is a view showing a current distribution in an on-state in the configuration of Comparative Example 3.
Figure 24:
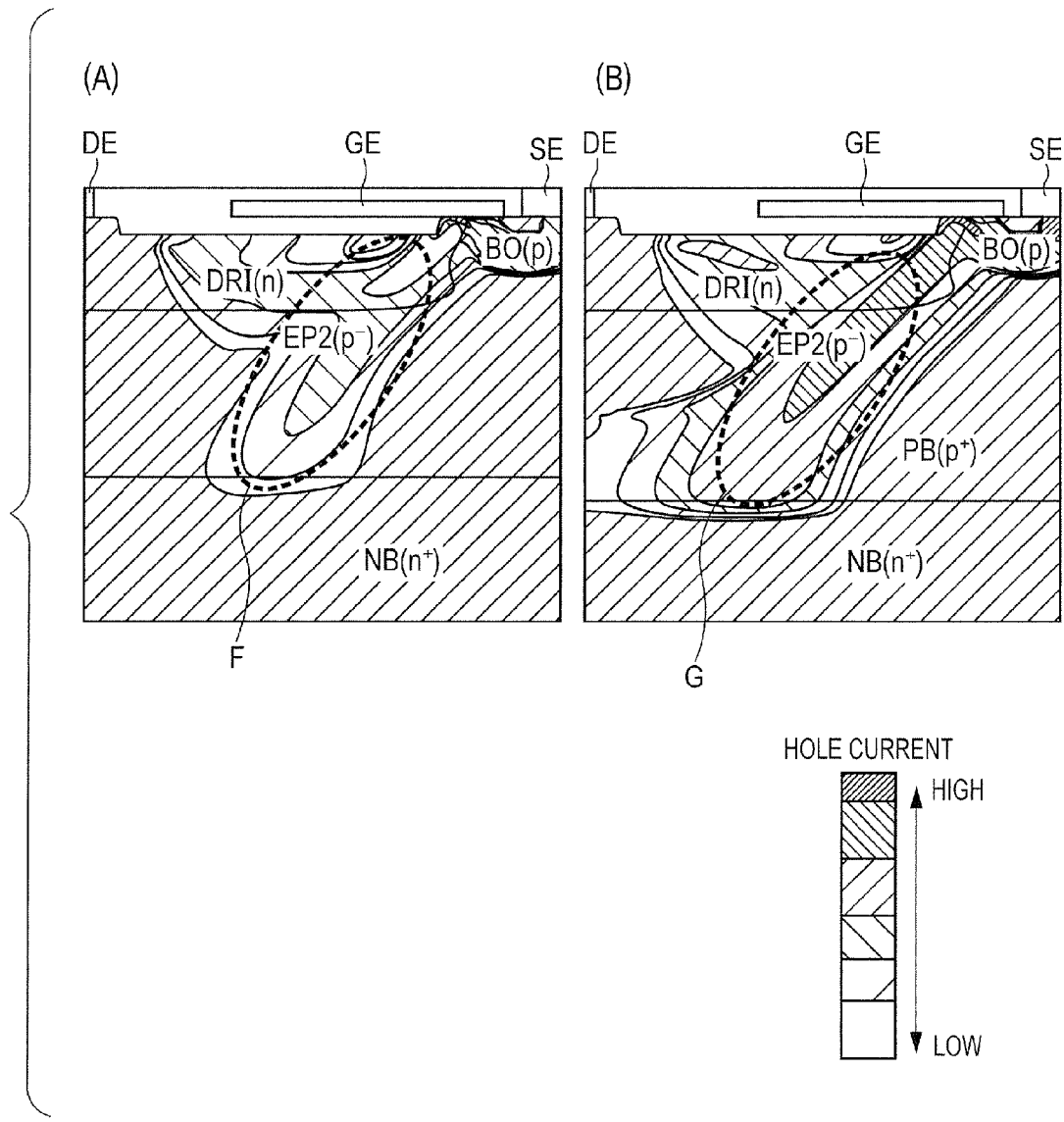
FIG. 24A is a view showing a hole current distribution in an on-state in the configuration of Comparative Example 2 and FIG. 24B is a view showing a hole current distribution in an on-state in the configuration of Comparative Example 3.

Further, the present inventors have investigated the relationship between a drain voltage Vd and a drain current Id in the structure of FIG. 15 (Comparative Example 2) and the structure of FIG. 18 (Comparative Example 3). The results are shown in FIG. 22. Here, the specific on-resistance in the structure showing the results of FIG. 22 is 1.4 mΩ·cm² and the gate voltage in the structure is 5 V.

In reference to FIG. 22, it has been found that, whereas the drain current Id of FIG. 18 is smaller than that of FIG. 15 when the drain voltage Vd is not more than 70 V, when the drain voltage Vd is not less than about 70 V, the drain current Id of FIG. 18 increases rapidly and comes to be larger than that of FIG. 15.

Here, the present inventors have comparatively studied the state of applying a high bias to a drain at on-operation in each of the structures of FIGS. 15 and 18. Specifically, a current distribution and impact ionization rates are simulated in an on-state, namely under the condition of a gate voltage of 5 V and a drain voltage Vd of 75 V. The results of the impact ionization rates are shown in FIGS. 23A and 23B and the current distributions are shown in FIGS. 23C and 23D. Further, the distributions of hole currents under the condition of the same on-state are shown in FIGS. 24A and 24B.

In reference to FIGS. 23C and 23D, from the current distributions shown with contour lines of the current potential, it is obvious that electric current flows also in an n⁺ buried region NB (to which a potential identical to a drain electrode DE is applied) in any of the structures of FIGS. 15 and 18.

In reference to FIGS. 23A and 23B, it is obvious that the impact ionization rates in the structure of FIG. 18 are larger than those in the structure of FIG. 15 in the vicinity of a junction (region D or E surrounded by a dotted line in particular) between an n⁺ buried region NB and a p⁺ buried region PB (p⁻ epitaxial region EP2). This is because, in the structure of FIG. 18, the p⁺ buried region PB is formed so as to be in contact with the n⁺ buried region NB and a high electric field is caused at the junction. It is estimated that, since electric current flows also in the p⁺ buried region PB in the direction of being in contact with the n⁺ buried region NB, the impact ionization rates determined by strength through the product of an electric field and an electric current in the structure of FIG. 18 increase.

In reference to FIGS. 24A and 24B, the hole currents are caused by impact ionization. Consequently, the values of the hole currents in the region "G" surrounded by the dotted line are larger than those in the region "F" surrounded by the dotted line. It is estimated that the rapid increase of the drain current Id shown in the structure of FIG. 18 when the drain voltage Vd is not less than 70 V in FIG. 22 in particular is caused by the increase of the hole currents accompanying the increase of the impact ionization rates.

From above results, it has been found that, in a configuration of forming a p⁺ buried region PB so as to be in contact with the whole plane of an n⁺ buried region NB like FIG. 18, an on-breakdown-voltage decreases by the increase of impact ionization rates during on-operation.

Investigations similar to FIGS. 20 to 24 are hereunder carried out in the structure of FIG. 1 according to the present embodiment. The results are shown in FIGS. 25 to 29.

Figure 25:
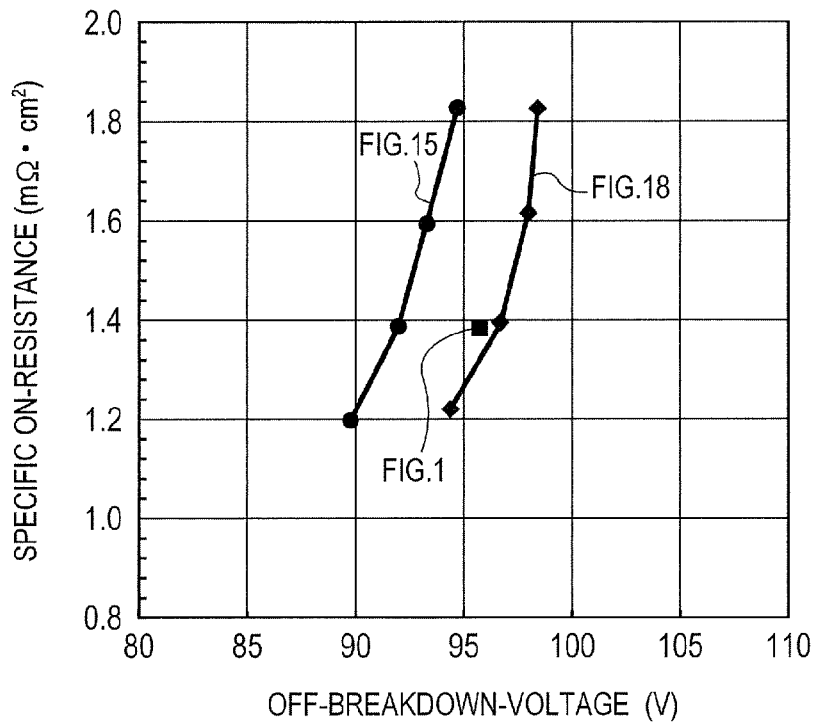
FIG. 25 is a graph showing the relationship between an off-breakdown-voltage and a specific on-resistance in the configurations of Comparative Examples 2 and 3 and Embodiment 1.
Figure 26:
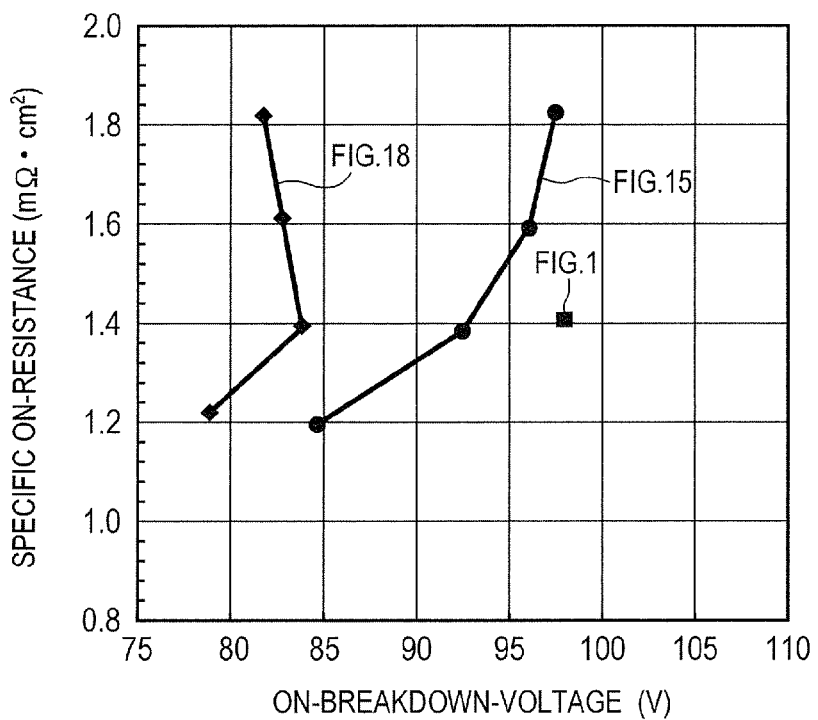
FIG. 26 is a graph showing the relationship between an on-breakdown-voltage and a specific on-resistance in the configurations of Comparative Examples 2 and 3 and Embodiment 1.
Figure 27:
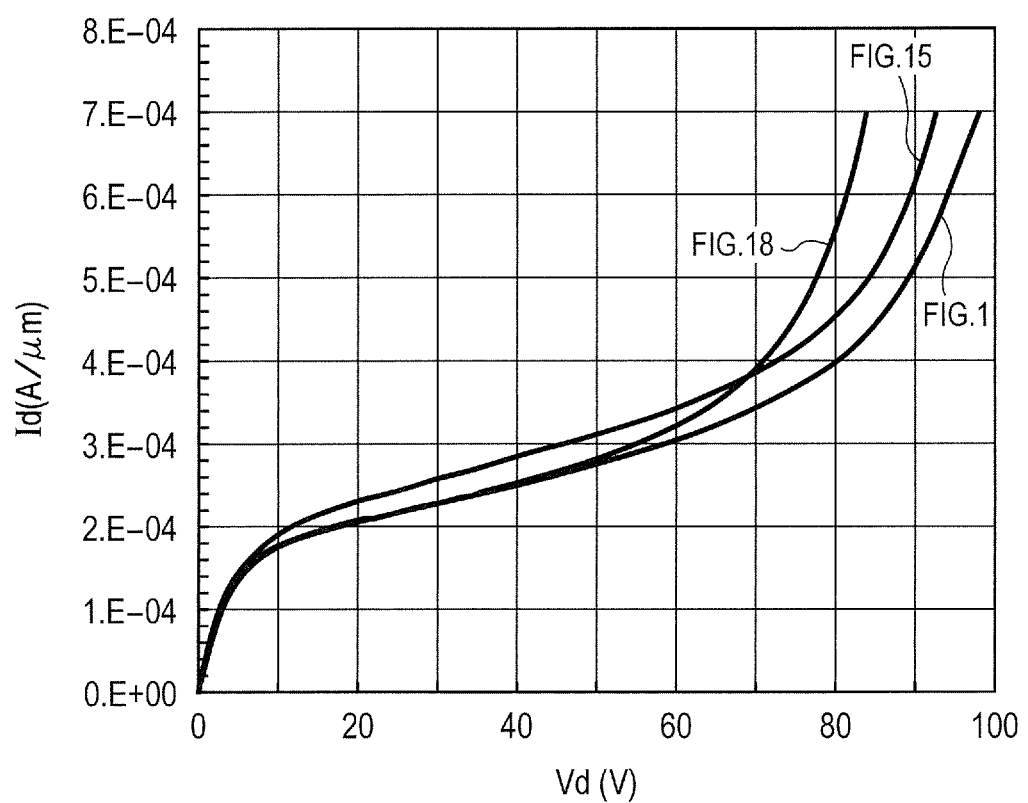
FIG. 27 is a graph showing the relationship between a drain voltage and a drain current in the configurations of Comparative Examples 2 and 3 and Embodiment 1.

In reference to FIGS. 25, 26, and 27, those are the figures of the cases where corresponding data in the structure of FIG. 1 according to the present embodiment are added to the data shown in FIGS. 20, 21, and 22, respectively. The data added in relation to FIG. 1 are obtained by simulation under the condition of a specific on-resistance of 1.4 mΩ·cm².

From FIG. 25, it is obvious that the value of an off-breakdown-voltage in the structure of FIG. 1 is similar to that in the structure of FIG. 18 (Comparative Example 3) when the specific on-resistance is 1.4 mΩ·cm². From FIG. 26 further, it is obvious the value of an on-breakdown-voltage in the structure of FIG. 1 is larger than that of FIG. 15. From FIG. 27 furthermore, it is obvious that the drain current Id in the configuration of FIG. 1 is identical to or smaller than those in the configurations of FIGS. 15 and 18 regardless of the value of a drain voltage Vd. In the structure of FIG. 1, in a region where the drain voltage Vd is not less than 70 V in particular, such rapid increase of the value of drain current Id as shown in the structure of FIG. 18 is not seen.

Impact ionization rates in an on-state in the structure of FIG. 1 (Embodiment 1) are shown in FIG. 28A and an electric current distribution is shown in FIG. 28B.

By comparing FIG. 28A with FIG. 23B, it is obvious that the impact ionization rates in the structure of FIG. 1 are lower than those in the structure of FIG. 18 in the vicinity of a junction between an n⁺ buried region NB and a p⁺ buried region PB (particularly the region H or E surrounded by a dotted line). Further by comparing FIG. 29 with FIG. 24B, it is obvious that the hole currents in the region J surrounded by the dotted line in particular are smaller than those in the region G surrounded by the dotted line. In this way, since the values of the hole currents are small in the structure of FIG. 1, the rapid increase of the drain current Id caused by the increase of hole currents is not seen as shown in FIG. 27.

Figure 28:
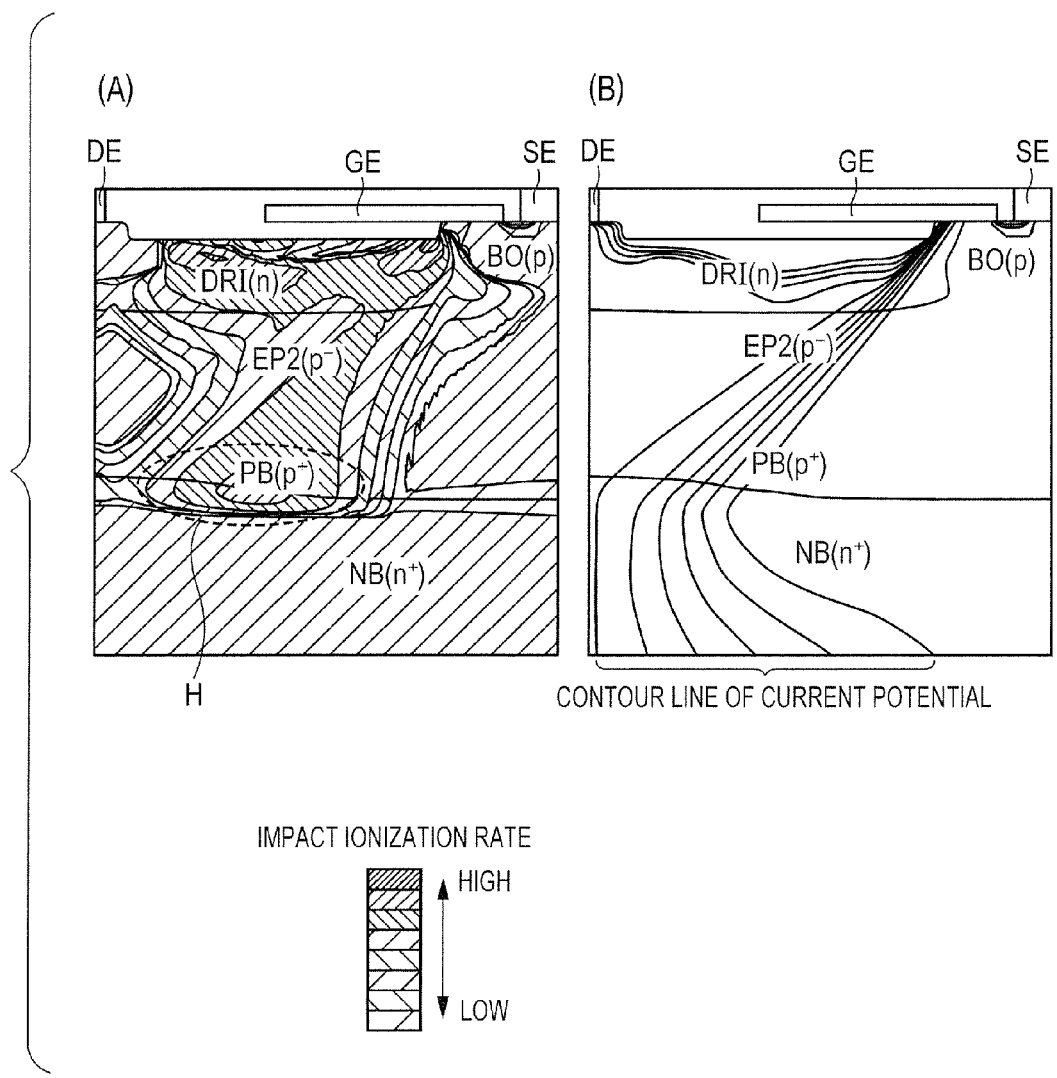
FIG. 28A is a view showing impact ionization rates and FIG. 28B is a view showing a current distribution in an on-state in the configuration of Examples 1.
Figure 29:
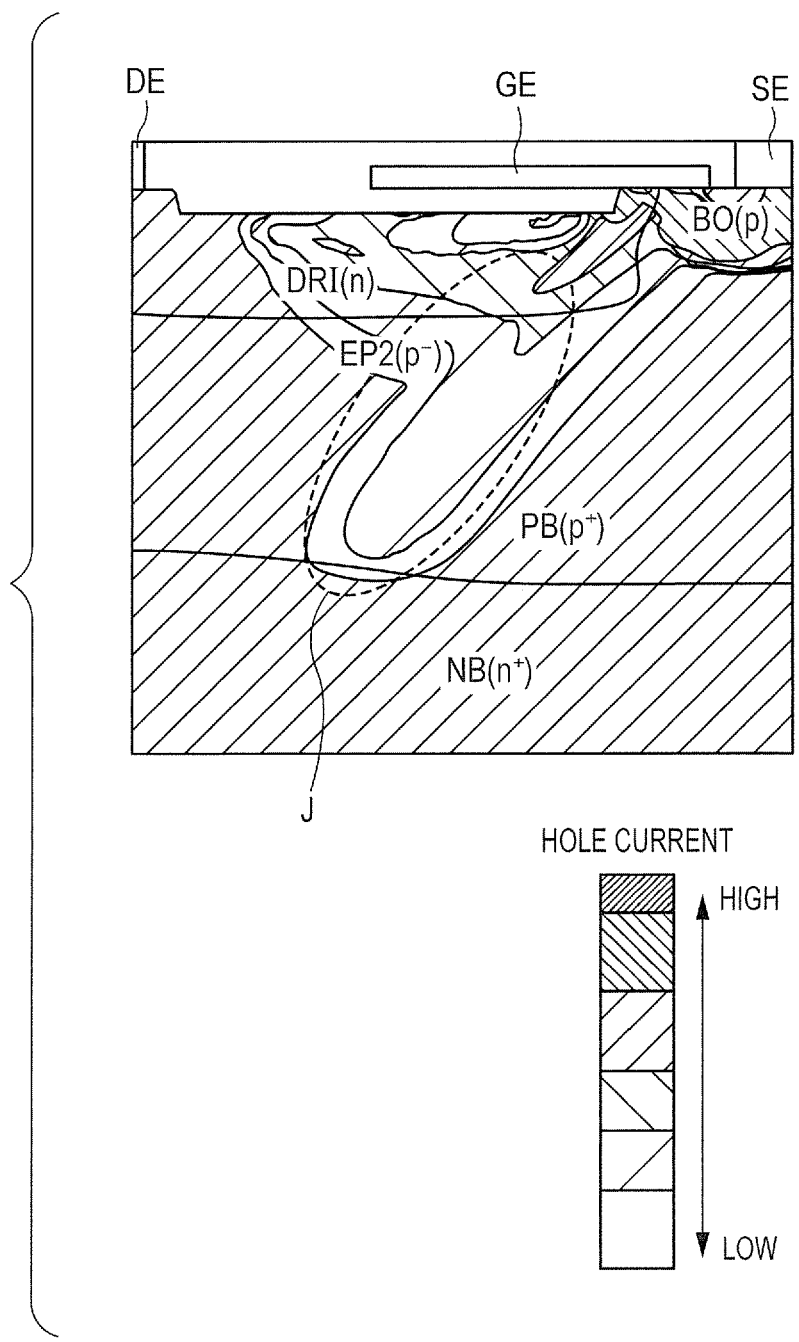
FIG. 29 is a view showing a hole current distribution in an on-state in the configuration of the first example of Embodiment 1.

Here in each of FIGS. 28 and 29, the curved line at the boundary between the n⁺ buried region NB and the p⁺ buried region PB rises upward on the left side. It shows that the p⁺ buried region PB is not allocated at rising part.

As stated above, in the present embodiment, firstly since a p⁻ epitaxial region EP1 is electrically isolated from a p⁻ epitaxial region EP2 by an n⁺ buried region NB to which a potential identical to a drain potential is applied, it is possible to reduce malfunctions even when a semiconductor device is used as a high-side element.

Further, by allocating a p⁺ buried region PB between an n⁺ buried region NB and a p⁻ epitaxial region EP2, it is possible to increase an off-breakdown-voltage.

Here, like the present embodiment, a p⁺ buried region PB coupled to an n⁺ buried region NB is allocated at least immediately under a junction between an n-type drift region DRI and a p-type body region BO. On this occasion, at the junction between the p⁺ buried region PB and the n⁺ buried region NB, the effect of dispersing the concentration of an electric field increases at the junction between the n-type drift region DRI and the p-type body region BO. In the p⁺ buried region PB immediately under the junction between the n-type drift region DRI and the p-type body region BO, the distance from the junction between the n-type drift region DRI and the p-type body region BO to the p⁺ buried region PB is the shortest. Consequently, by allocating a p⁺ buried region PB immediately under a junction between an n-type drift region DRI and a p-type body region BO, the effect of dispersing a strong electric field strength increases at the junction between the n-type drift region DRI and the p-type body region BO. As a result, the effect of improving the off-breakdown-voltage of a semiconductor device increases.

In the present embodiment further, a p+ buried region PB is not formed so as to be in contact with the whole plane of an n+ buried region NB and the p+ buried region PB is not allocated immediately under a drain electrode DE. In this way, as it is obvious from the fact that the impact ionization rates in the region H in FIG. 28A are lower than those in the region E of FIG. 23B, it is possible to inhibit the impact ionization rates from increasing. This is because, by not allocating a p+ buried region PB immediately under a drain electrode DE like FIG. 28A, it is possible to inhibit the electric field in the region from increasing and resultantly inhibit impact ionization rates determined by strength through the product of an electric field and an electric current from increasing. Consequently, by not allocating a p+ buried region PB immediately under a drain electrode DE, it is possible to inhibit an on-breakdown-voltage from decreasing.

That is, in the above configuration, even when a semiconductor device is used as a high-side element, malfunctions are few and breakdown voltage can be kept at a high level during both on-operation and off-operation.

Embodiment 2

Figure 30:
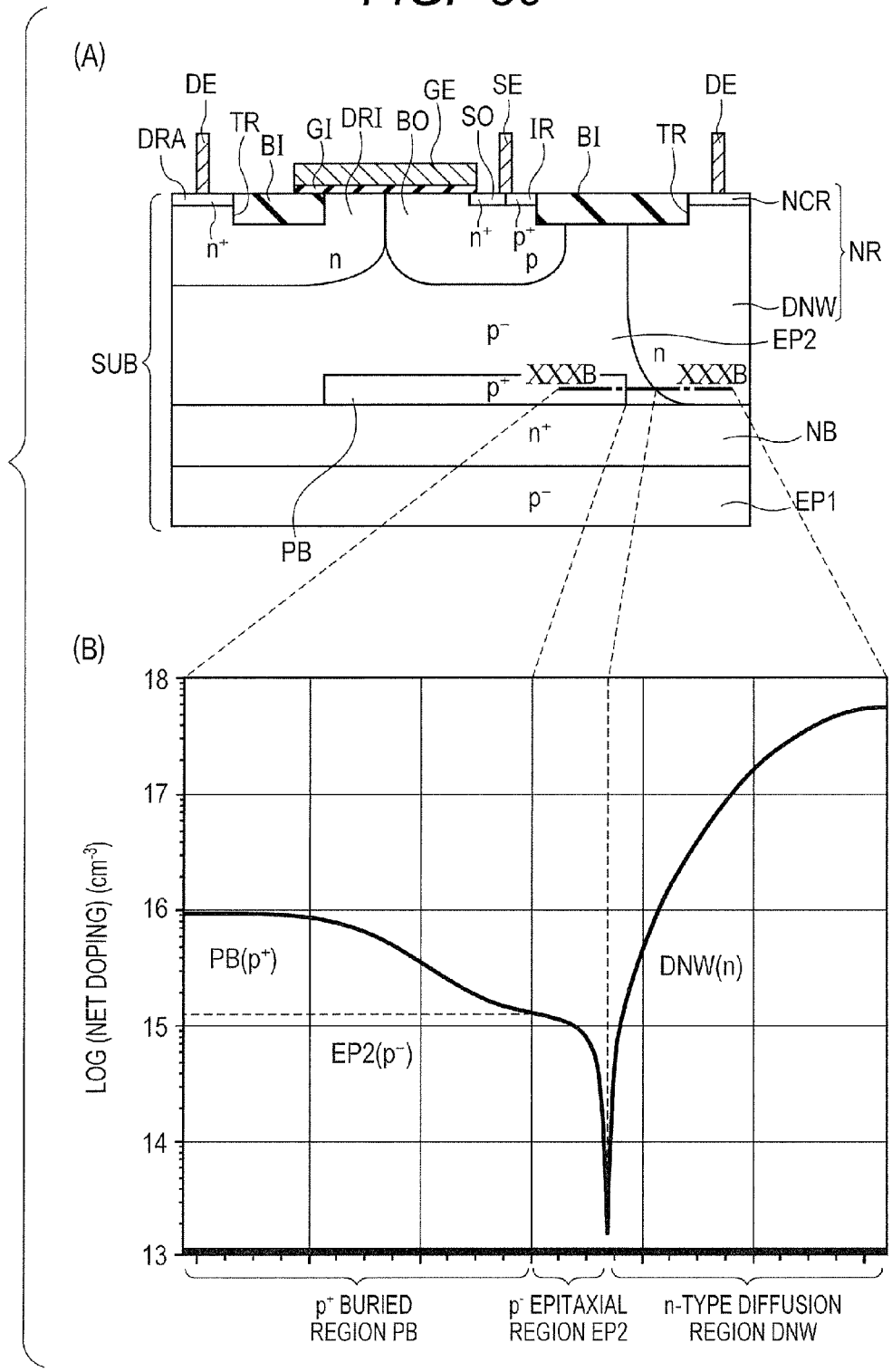
FIG. 30A is a sectional view schematically showing the configuration of a semiconductor device in the first example according to Embodiment 2 of the present invention and FIG. 30B is a view showing an impurity concentration distribution taken on the dashed-dotted line XXXB-XXXB of FIG. 30A.

Firstly, the configuration of a semiconductor device according to the present embodiment is explained in reference to FIGS. 30A and 30B.

In reference to FIG. 30A, a semiconductor device according to the first example of the present embodiment basically has a configuration similar to that of FIG. 1 according to Embodiment 1 but further has an n-type region (seventh region) NR.

An n-type region NR is formed in a semiconductor substrate SUB so as to reach an n+ buried region NB from the main surface of the semiconductor substrate SUB. The n-type region NR has an n-type diffusion region DNW extending from the main surface side so as to reach the n+ buried region NB and an n-type contact region NCR being formed over the main surface and having an n-type impurity concentration higher than that in the n-type diffusion region DNW. An electrode DE to which a drain potential is applied is formed over the main surface of the semiconductor substrate SUB so as to be electrically coupled to the n-type contact region NCR. In this way, the n-type region NR and the n+ buried region NB are configured so that a drain potential identical to an n+ drain region DRA is applied.

An STI structure TR and BI is formed over the main surface of the semiconductor substrate SUB between the n-type contact region NCR and a p+ impurity region IR.

A p+ buried region PB is formed so as not to directly be in contact with the n-type diffusion region DNW by interposing a p− epitaxial region EP2 between the p+ buried region PB and the n-type diffusion region DNW. The p+ buried region PB is formed so as to be in contact with both the n+ buried region NB and the p− epitaxial region EP2.

Here, the part other than the part stated above in the configuration of the present embodiment is nearly identical to the configuration shown in FIG. 1 and hence an identical component is represented by an identical code and the explanations are not repeated.

In reference to FIG. 30B, the curved line shown by the solid line in the figure shows an impurity concentration distribution in the region shown by the dashed-dotted line in FIG. 30A, namely the parts of the p+ buried region PB, the p− epitaxial region EP2, and the n-type diffusion region DNW. The vertical axis in FIG. 30B represents a logarithmic value of Net Doping and the horizontal axis represents a position (on the dashed-dotted line XXXB-XXXB) in the semiconductor substrate SUB.

The concentration of p-type impurities in the p+ buried region PB is higher than that contained in the p− epitaxial region EP2. Specifically, the p-type impurity concentration in the p+ buried region PB is about $1 \times 10^{16}$ cm$^{-3}$ for example and the p-type impurity concentration in the p− epitaxial region EP2 is $1 \times 10^{15}$ cm$^{-3}$ for example. From the fact that an inflection point exists in the graph in the vicinity of the boundary between the p+ buried region PB and the p− epitaxial region EP2, it is obvious that the p− epitaxial region EP2 having an impurity concentration lower than that of the p+ buried region PB is formed between the p+ buried region PB and the n-type diffusion region DNW. At the junction between the n-type diffusion region DNW and the p− epitaxial region EP2 in contrast, the n-type impurities in the n-type diffusion region DNW and p-type impurities in the p− epitaxial region EP2 are compensated with each other and the concentration distribution of impurities shown in the figure is obtained. Since a steep concentration change is recognized in the vicinity of the boundary between the p− epitaxial region EP2 and the n-type diffusion region DNW, the existence of the boundary between the two regions is confirmed.

Figure 31:
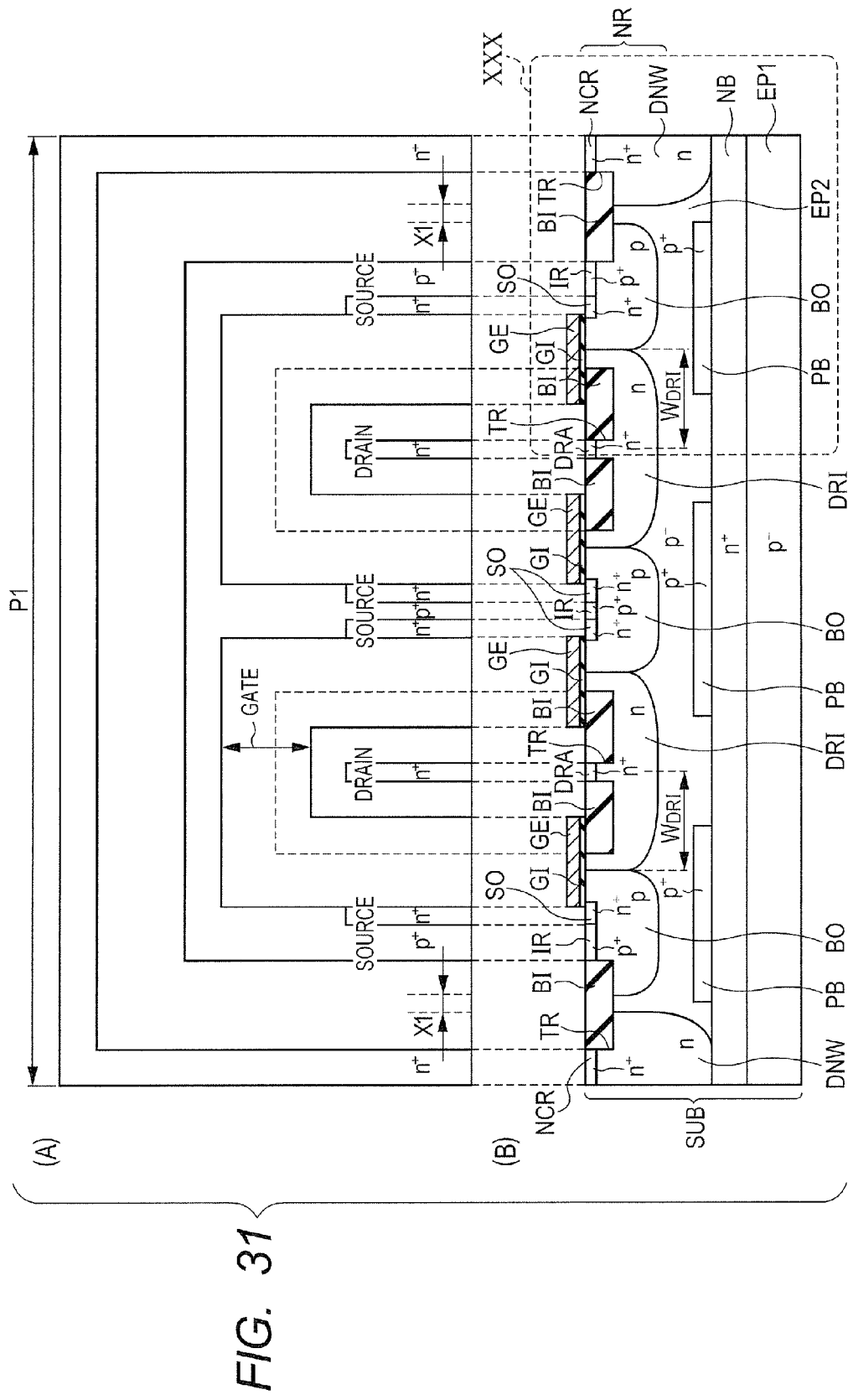
FIG. 31A is a plan view and FIG. 31B is a sectional view schematically showing the configuration of a unit part in an array of semiconductor devices one of which is shown in FIGS. 30A and 30B.

An array of LDMOS transistors of the first example shown in FIG. 30A is hereunder explained in reference to FIGS. 31A and 31B.

In reference to FIGS. 31A and 31B, the array of the LDMOS transistors is basically the same as the array of the first example according to Embodiment 1 shown in FIGS. 3A and 3B but, by allocating an n-type diffusion region DNW as shown in the figure, the configuration in the range of the pitch P1 in the figure is repeated in the direction along the main surface. Here, FIG. 30A represents a sectional view of the region XXX surrounded by the dotted line in FIGS. 31A and 31B.

Here, although the configuration of allocating an n-type region NR on the side closer to a source region SO than the side of a drain region DRA is explained in the first example according to the present embodiment, it is also possible to allocate an n-type region NR on the side closer to a drain region DRA than the side of a source region SO. A configuration of allocating an n-type region NR on the side closer to a drain region DRA than the side of a source region SO is explained hereunder as the second example according to the present embodiment in reference to FIGS. 32 and 33.

Figure 32:
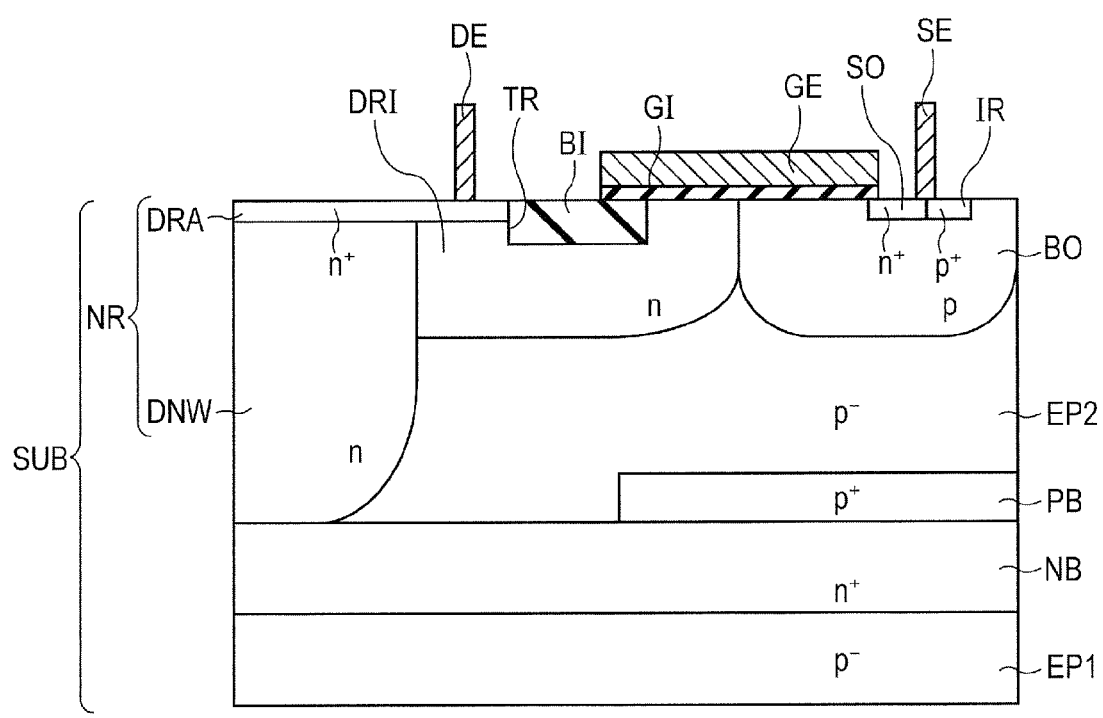
FIG. 32 is a sectional view schematically showing the configuration of a semiconductor device in the second example according to Embodiment 2 of the present invention.
Figure 33:
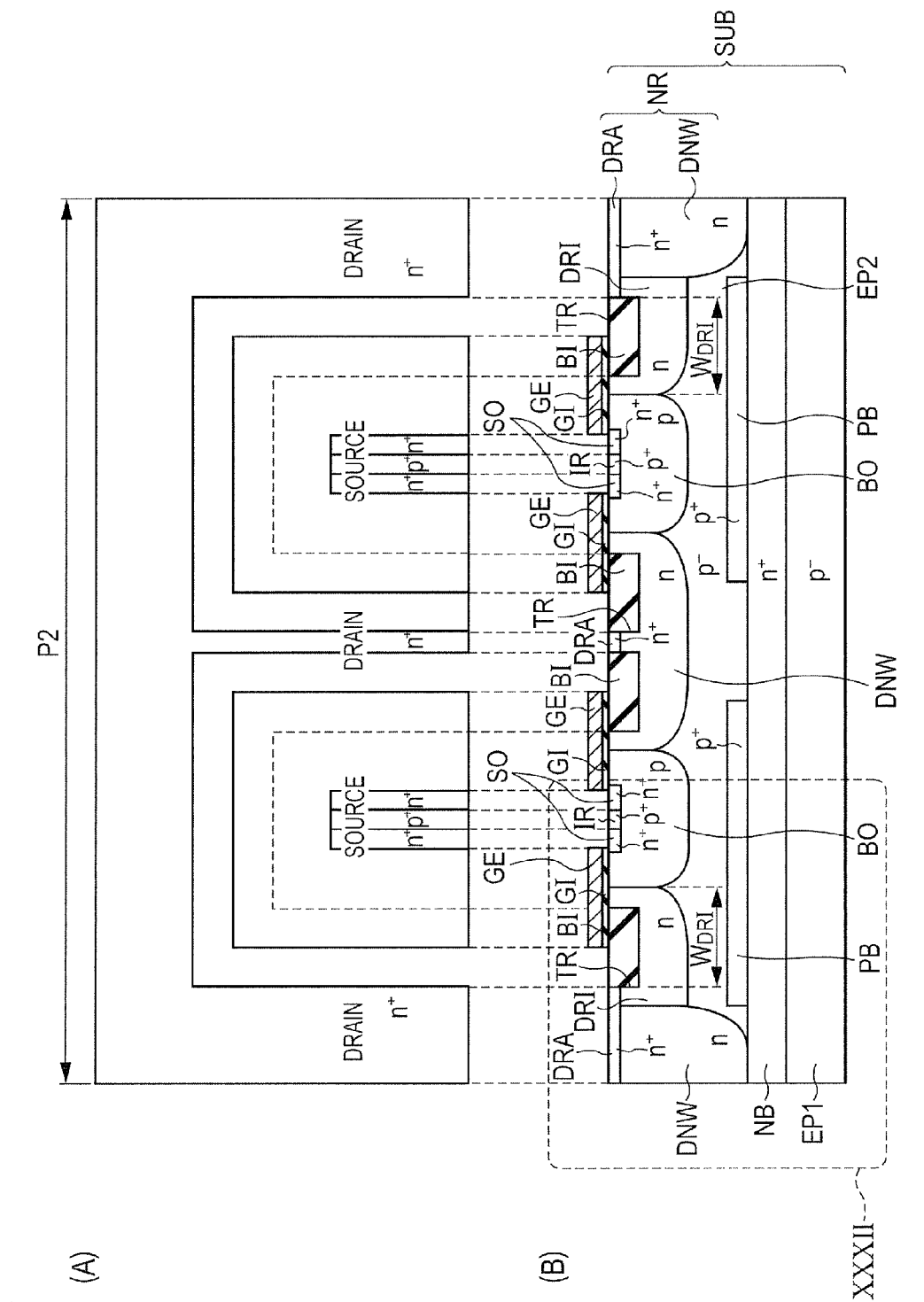
FIG. 33A is a plan view and FIG. 33B is a sectional view schematically showing the configuration of a unit part in an array of semiconductor devices one of which is shown in FIG. 32.

In reference to FIG. 32, in a semiconductor device of the second example according to the present embodiment, an n-type diffusion region DNW is coupled to an n-type drift region DRI and an n+ contact region formed on the main surface side of the n-type diffusion region DNW is integrated with an n+ drain region DRA.

The part other than the part stated above in the configuration of the second example is nearly identical to the configuration of the first example shown in FIGS. 30A and 30B and hence an identical component is represented by an identical code and the explanations are not repeated.

In reference to FIGS. 33A and 33B, the array of the LDMOS transistors of the second example is basically the same as the array of the second example according to Embodiment 1 shown in FIGS. 4A and 4B but, by allocating an n-type diffusion region DNW as shown in the figure, the configuration in the range of the pitch P2 in the figure is repeated in the direction along the main surface. Here, FIG. 32 represents a sectional view of the region XXXII surrounded by the dotted line in FIGS. 33A and 33B.

In the array of the second example, an n-type diffusion region DNW can be coupled to an n-type drift region DRI and it is not necessary to install an STI structure TR and BI for electrically separating the n-type diffusion region DNW from a $p^+$ impurity region IR unlike the array of the first example shown in FIGS. 30A and 30B. Consequently, the pitch P2 in the array of the second example can be smaller than the pitch P1 in the array of the first example. In the array of the first example shown in FIGS. 30A and 30B in contrast, since a gate electrode GE is allocated so as to surround the outer circumference of an $n^+$ drain region DRA over the main surface, it is possible to inhibit: a depletion layer from expanding outward; and breakdown voltage from decreasing.

An n-type diffusion region DNW according to the present embodiment may also be formed so as to be in contact with an $n^+$ buried region NB by implanting n-type impurities in the vicinity of the main surface of a semiconductor substrate SUB at a high concentration and successively dispersing them through annealing treatment at a high temperature for a long time. Otherwise, an n-type diffusion region DNW may also be formed so as to be in contact with an $n^+$ buried region NB by implanting n-type impurities into a deep site of a $p^-$ epitaxial region EP2 by high energy implantation and successively dispersing them through annealing treatment.

Function effects in the present embodiment are explained hereunder. In the present embodiment, the following function effects are obtained in addition to the function effects of Embodiment 1.

In the present embodiment, by forming a configuration of interposing a $p^-$ epitaxial region EP2 having a p-type impurity concentration lower than that of a $p^+$ buried region PB between the $p^+$ buried region PB and an n-type diffusion region DNW, it is possible to inhibit contact resistance between the n-type diffusion region DNW and an $n^+$ buried region NB from decreasing.

Embodiment 3

In an analog-digital consolidated technology, an LDMOS transistor like Embodiment 1 is sometimes formed over one chip through a process identical to the process of a CMOS (Complementary MOS), a bipolar transistor, a diode, a memory device, etc. When a transistor according to Embodiment 1 is laid out over such a chip, it is necessary to electrically isolate the transistor from other elements. In the present embodiment, a structure for electrical isolation is explained in reference to FIGS. 34 and 35.

Figure 34:
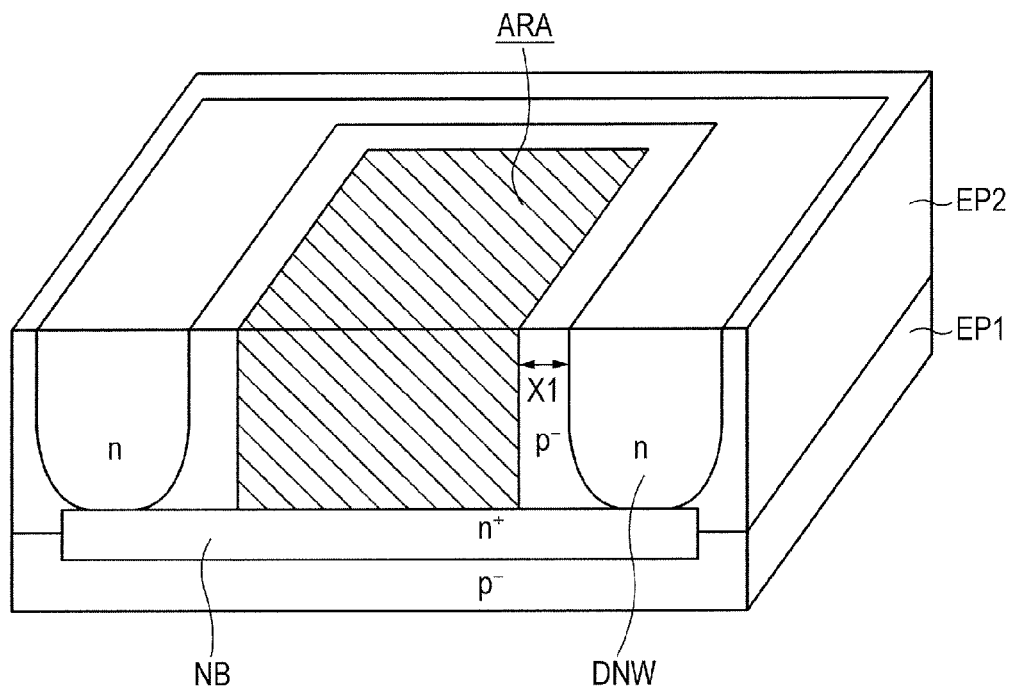
FIG. 34 is a sectional perspective view schematically showing the configuration of a semiconductor device according to Embodiment 3 of the present invention.
Figure 35:
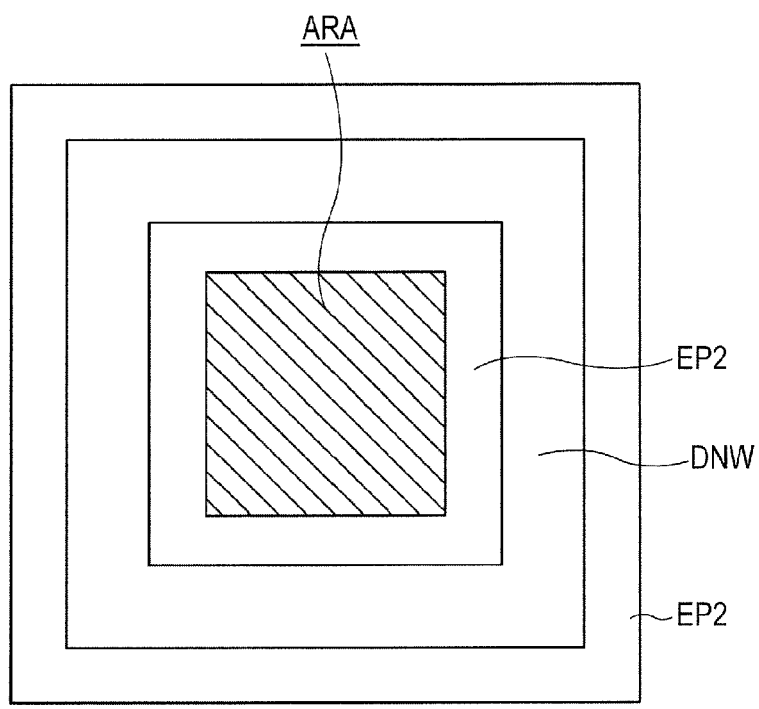
FIG. 35 is a schematic plan view showing the state where an n-type diffusion region DNW shown in FIG. 34 surrounds the circumference of an array region ARA of lateral high-voltage MOS transistors in a planar view.

In reference to FIGS. 34 and 35, in the present embodiment, an n-type diffusion region DNW (seventh region) is formed so as to surround the circumference of a region ARA where an array (lateral elements) in which the layout of LDMOS transistors shown in FIGS. 3A and 3B for example is repeated is allocated in a planar view. The n-type diffusion region DNW is formed in a semiconductor substrate SUB so as to reach an $n^+$ buried region NB from the main surface of the semiconductor substrate SUB in the manner of configuring a p-n junction with a $p^-$ epitaxial region EP2. The array of LDMOS transistors is electrically isolated from other elements by the n-type diffusion region DNW. A potential identical to a drain electrode DE (refer to FIGS. 30A and 30B) is applied to the n-type diffusion region DNW as the isolation region and the $n^+$ buried region NB.

Otherwise, the n-type diffusion region DNW in FIGS. 34 and 35 may also be the n-type diffusion region DNW in FIGS. 32, 33A and 33B. On this occasion, the array of LDMOS transistors formed inside the n-type diffusion region DNW in FIGS. 33A and 33B is electrically isolated from other elements by the n-type diffusion region DNW in FIGS. 33A and 33B.

If n-type impurities in an n-type diffusion region DNW diffuse up to an array region ARA of LDMOS transistors, the transistor performance is influenced. Consequently, it is necessary to design the interval X1 between an n-type diffusion region DNW and an array region ARA so as to be a width not influencing transistor performance. The interval X1 corresponds to the interval X1 in FIGS. 31A and 31B when the n-type diffusion region DNW in FIGS. 31A and 31B corresponds to the n-type diffusion region DNW in FIG. 34 for example.

Embodiment 4

Figure 36:
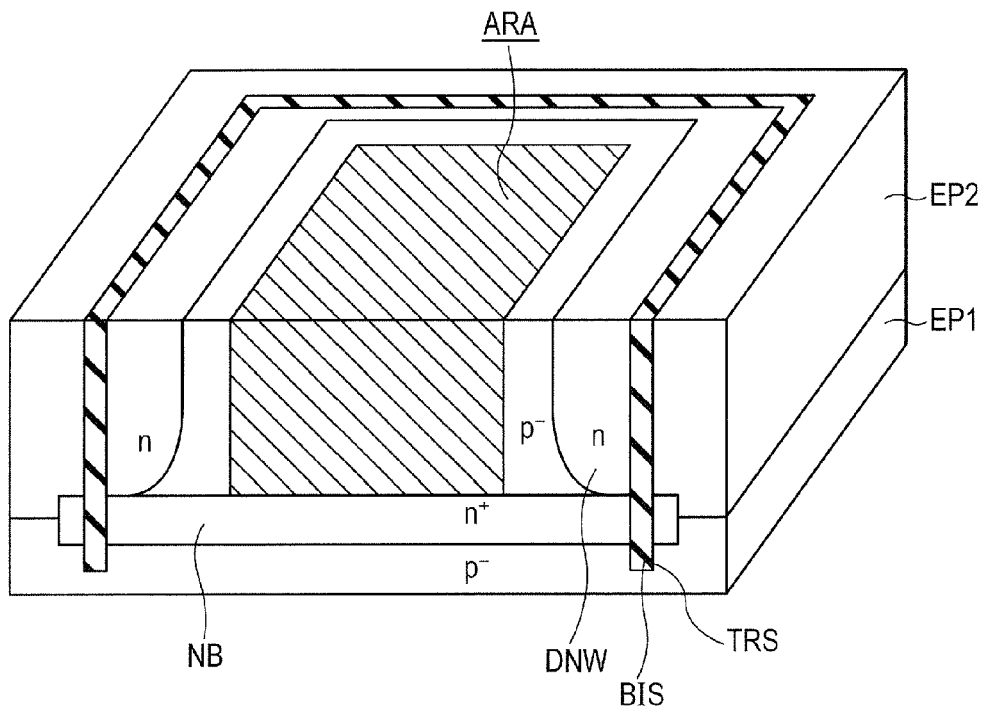
FIG. 36 is a sectional perspective view schematically showing the configuration of a semiconductor device according to Embodiment 4 of the present invention.
Figure 37:
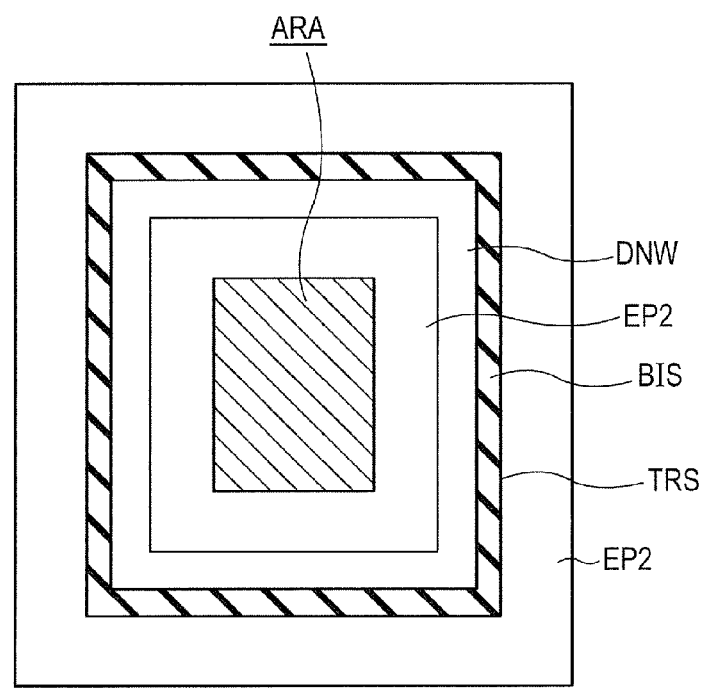
FIG. 37 is a schematic plan view showing the state where an isolation trench TRS shown in FIG. 36 surrounds the circumference of an array region ARA of lateral high-voltage MOS transistors in a planar view.

In reference to FIGS. 36 and 37, in the present embodiment, a trench isolation for electrically isolating an array region ARA of LDMOS transistors from other elements is formed. The trench isolation has an isolation trench TRS and a filled insulation layer BIS.

The isolation trench TRS surrounds the circumference of the array region ARA of LDMOS transistors in a planar view. The isolation trench TRS reaches a $p^-$ epitaxial region EP1 passing from the main surface of a semiconductor substrate SUB through an $n^+$ buried region NB. In this way, it is possible to inhibit electrical coupling between an array region ARA and another element adjacent to the array region for example caused by the $n^+$ buried region NB.

The filled insulation layer BIS is formed so as to fill the interior of the isolation trench TRS. In the present embodiment, since a trench isolation is used for electrically isolating an array region ARA from other elements, it is unnecessary to take the influence of the diffusion of n-type impurities on a transistor into consideration unlike the case of installing an n-type diffusion region DNW in Embodiment 3. Even when an n-type diffusion region DNW expands in the direction along a main surface toward the outside of a trench isolation for example, the diffusion is inhibited by the trench isolation and hence the n-type diffusion region DNW is not allocated outside the trench isolation as shown in FIG. 36.

Consequently, it is possible to: narrow the interval between a trench isolation and an array region ARA adjacent to the outside (not shown in the figure) (for example, it is possible to make the interval zero) further than the case of diffusion and isolation in Embodiment 3; and materialize chip shrink further than the case of Embodiment 3.

Embodiment 5

Figure 38:
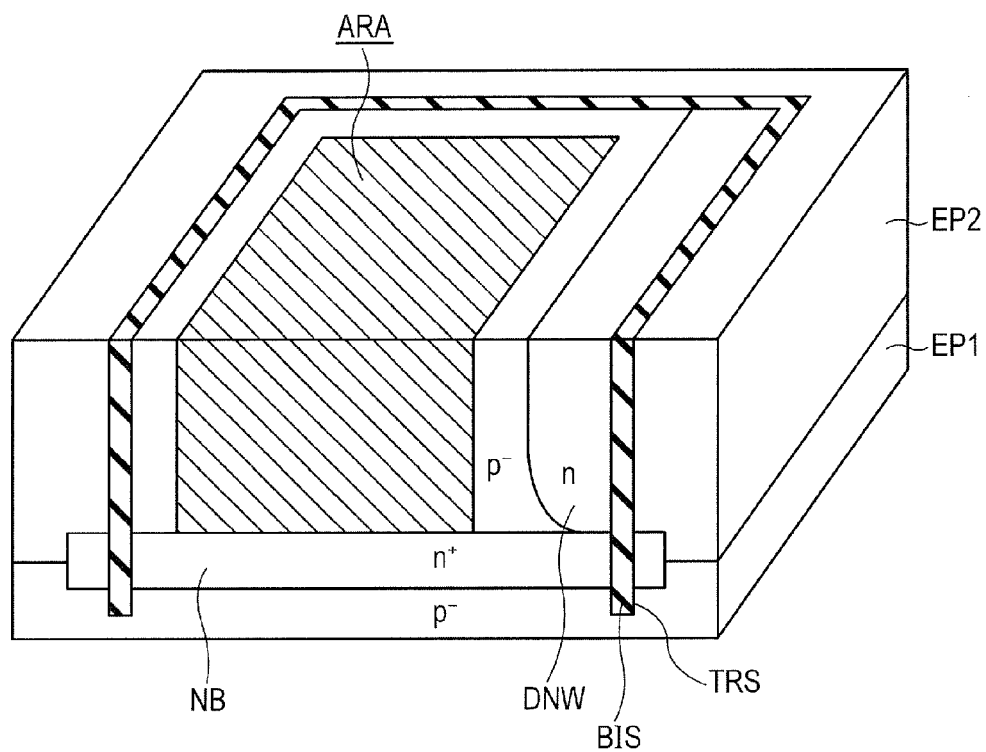
FIG. 38 is a sectional perspective view schematically showing the configuration of a semiconductor device according to Embodiment 5 of the present invention.
Figure 39:
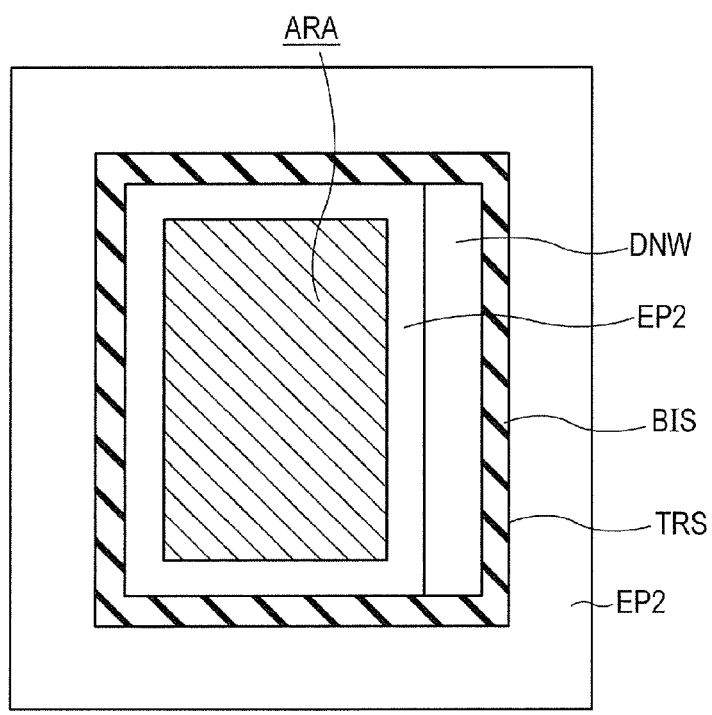
FIG. 39 is a schematic plan view showing the state where an n-type diffusion region DNW shown in FIG. 38 is allocated around an array region ARA of lateral high-voltage MOS transistors.

In reference to FIGS. 38 and 39, in the present embodiment, an n-type diffusion region DNW in Embodiment 4 is formed only on one side (on the right side in the figures) of the circumference of a region ARA in a planar view and the other part of the configuration is the same as the configuration of Embodiment 4.

In the present embodiment, an array region ARA is electrically isolated from other elements by a trench isolation. Consequently, an n-type diffusion region DNW is formed exclusively for applying a potential identical to a potential applied to a drain electrode DE (refer to FIGS. 30A and 30B) to an $n^+$ buried region NB. Consequently, an n-type diffusion region DNW may be formed only at a part of the circumference of an array region ARA on a main surface. In this way, it is possible to: reduce a semiconductor device forming area on a main surface to the extent that the region where an n-type diffusion region DNW is formed reduces; and obtain a chip area reduction effect.

Embodiment 6

Figure 40:
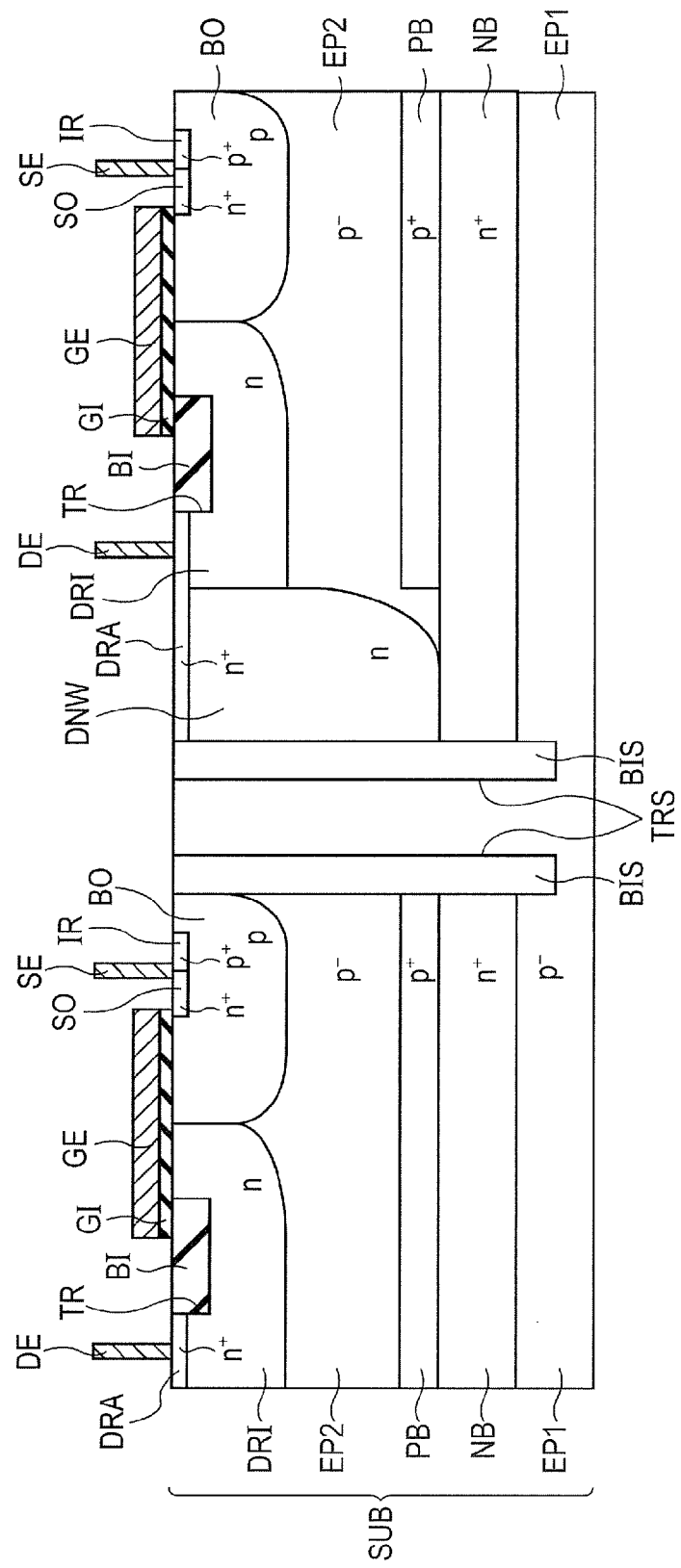
FIG. 40 is a sectional view schematically showing the configuration of semiconductor devices according to Embodiment 6 of the present invention.

In reference to FIG. 40, it is possible to use an LDMOS transistor shown on the left side in FIG. 40 for example as another element electrically isolated from an array region ARA in Embodiments 2 to 5. The LDMOS transistor shown on the left side in FIG. 40 has a structure of Comparative Example 3 in FIG. 18 but may also have a structure of Comparative Example 1 in FIG. 12 or Comparative Example 2 in FIG. 15 for example. Further, the LDMOS transistor shown on the left side in FIG. 40 is only an example and a diode, an IGBT (Insulated Gate Bipolar Transistor), etc. may be formed. A structure of the second example according to Embodiment 1 of the present invention in FIGS. 3A and 3B is shown on the right side in FIG. 40 but an arbitrary structure according to another embodiment may also be used. The LDMOS transistor shown on the left side in FIG. 40 is formed as a layer identical to the layer of an LDMOS transistor having the structure of FIGS. 3A and 3B shown on the right side in FIG. 40.

In this way, by forming a $p^+$ buried region PB in the present embodiment shown on the right side in FIG. 40 and a $p^+$ buried region PB on the left side in FIG. 40 as an identical layer, it is possible to form both the regions simultaneously by only one time of film forming treatment and photoengraving treatment. Consequently, it is unnecessary to additionally prepare a processing mask (photomask for example) used for photoengraving treatment and manufacturing cost can be reduced.

The embodiments disclosed here are examples in every aspect and should not be regarded as restrictive. The scope of the present invention is represented not by the above explanations but by claims and is intended to include meanings equivalent to the claims and all modifications within the scope.

The present invention can be applied to a semiconductor device having a lateral element particularly advantageously.

What is claimed is:

1. A semiconductor device comprising:
   a semiconductor substrate having a main surface;
   a first region of a first conductivity type formed in said semiconductor substrate;
   a second region of said first conductivity type formed on the main surface side of said first region in said semiconductor substrate;
   a third region of a second conductivity type being formed on the main surface side of said second region in said semiconductor substrate and configuring a p-n junction with said second region;
   a fourth region of said first conductivity type being formed on the main surface side of said second region in said semiconductor substrate so as to be in contact with said second region and be adjacent to said third region and having a first conductivity type impurity concentration higher than that of said second region;
   a fifth region of said second conductivity type formed in said semiconductor substrate between said first region and said second region so as to electrically isolate said first region from said second region;
   a sixth region of the first conductivity type being formed in said semiconductor substrate between said fifth region and said second region and having a first conductivity type impurity concentration higher than that of said second region; and
   a drain region being formed over said main surface so as to be in contact with said third region and having a second conductivity type impurity concentration higher than that of said third region,
   wherein said sixth region is located at least immediately under a junction between said third region and said fourth region so as to not overlap with said drain region in a plan view.

2. A semiconductor device according to claim 1, further comprising:
   a seventh region of said second conductivity type formed in said semiconductor substrate so as to reach said fifth region from said main surface,
   wherein said semiconductor device is configured so that a potential identical to a potential applied to said drain region may be applied to said fifth and seventh regions,
   wherein said second region is interposed between said sixth region and said seventh region, and
   wherein said sixth region does not directly come into contact with said seventh region.

3. A semiconductor device according to claim 2,
   wherein a lateral element including said second, third, and fourth regions is formed, and
   wherein said seventh region is formed so as to surround the circumference of said lateral element over said main surface.

4. A semiconductor device according to claim 3,
   wherein said semiconductor substrate has a trench for isolation over said main surface, and
   wherein said trench for isolation surrounds the circumference of a region where said lateral element is formed over said main surface so as to be in contact with said seventh region outside said seventh region and is formed at least so as to pass through said fifth region from said main surface.

5. A semiconductor device according to claim 3, wherein said lateral element is a lateral insulation gate type field effect transistor.

* * * * *